(12) United States Patent
Ito et al.

(10) Patent No.: US 9,595,563 B2
(45) Date of Patent: Mar. 14, 2017

(54) NONVOLATILE MEMORY DEVICE

(71) Applicant: Panasonic Intellectual Property Management Co., Ltd., Osaka (JP)

(72) Inventors: Satoru Ito, Hyogo (JP); Takumi Mikawa, Shiga (JP); Kazuhiko Shimakawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 46 days.

(21) Appl. No.: 14/678,002

(22) Filed: Apr. 3, 2015

(65) Prior Publication Data
US 2015/0295012 A1    Oct. 15, 2015

(30) Foreign Application Priority Data

Apr. 15, 2014  (JP) .................................. 2014-083657

(51) Int. Cl.
*H01L 45/00* (2006.01)
*H01L 27/24* (2006.01)

(52) U.S. Cl.
CPC ...... *H01L 27/2463* (2013.01); *H01L 27/2436* (2013.01); *H01L 45/08* (2013.01); *H01L 45/1233* (2013.01); *H01L 45/146* (2013.01); *H01L 45/1675* (2013.01)

(58) Field of Classification Search
CPC .................................................. H01L 27/2463
See application file for complete search history.

(56) References Cited

U.S. PATENT DOCUMENTS

| 8,385,112 B2 * | 2/2013 | Liu ................................ 365/163 |
| 2007/0029676 A1 * | 2/2007 | Takaura ............. G11C 13/0004 257/758 |
| 2008/0203503 A1 | 8/2008 | Asao |
| 2010/0103718 A1 * | 4/2010 | Asao ....................... G11C 11/16 365/148 |

(Continued)

FOREIGN PATENT DOCUMENTS

| JP | 2004-355670 | 12/2004 |
| JP | 2008-192636 | 8/2008 |

(Continued)

*Primary Examiner* — Samuel Gebremariam
*Assistant Examiner* — Jonas T Beardsley
(74) *Attorney, Agent, or Firm* — McDermott Will & Emery LLP

(57) ABSTRACT

A nonvolatile memory device includes: a pair of first wirings extending in a first direction; a second wiring extending in a second direction crossing the first direction; a pair of third wirings extending in the second direction; and a fourth wiring located between the pair of the third wirings. The nonvolatile memory device has four resistance-change elements each which is provided adjacent to respective four crossing areas in which each of the pair of first wirings intersects with each of the pair of third wirings, and a first contact plug disposed at an intersection of two diagonals of a virtual tetragon defined by the four resistance-change elements. Two transistors arranged in the second direction, among four transistors, share each one first main terminal located between the pair of the first wirings, the shared each one first main terminal being connected to the second wiring.

22 Claims, 16 Drawing Sheets

(56) References Cited

U.S. PATENT DOCUMENTS

| | | | |
|---|---|---|---|
| 2012/0087171 A1* | 4/2012 | Lee | ................... H01L 45/04 |
| | | | 365/148 |
| 2012/0256156 A1 | 10/2012 | Arita et al. | |
| 2013/0250658 A1* | 9/2013 | Wei et al. | ............... 365/148 |
| 2014/0070162 A1* | 3/2014 | Iwayama | ..................... 257/4 |
| 2014/0092665 A1 | 4/2014 | Ueda et al. | |

FOREIGN PATENT DOCUMENTS

| | | |
|---|---|---|
| WO | 2009/008080 | 1/2009 |
| WO | 2011/080866 | 7/2011 |
| WO | 2013/005364 | 1/2013 |

\* cited by examiner

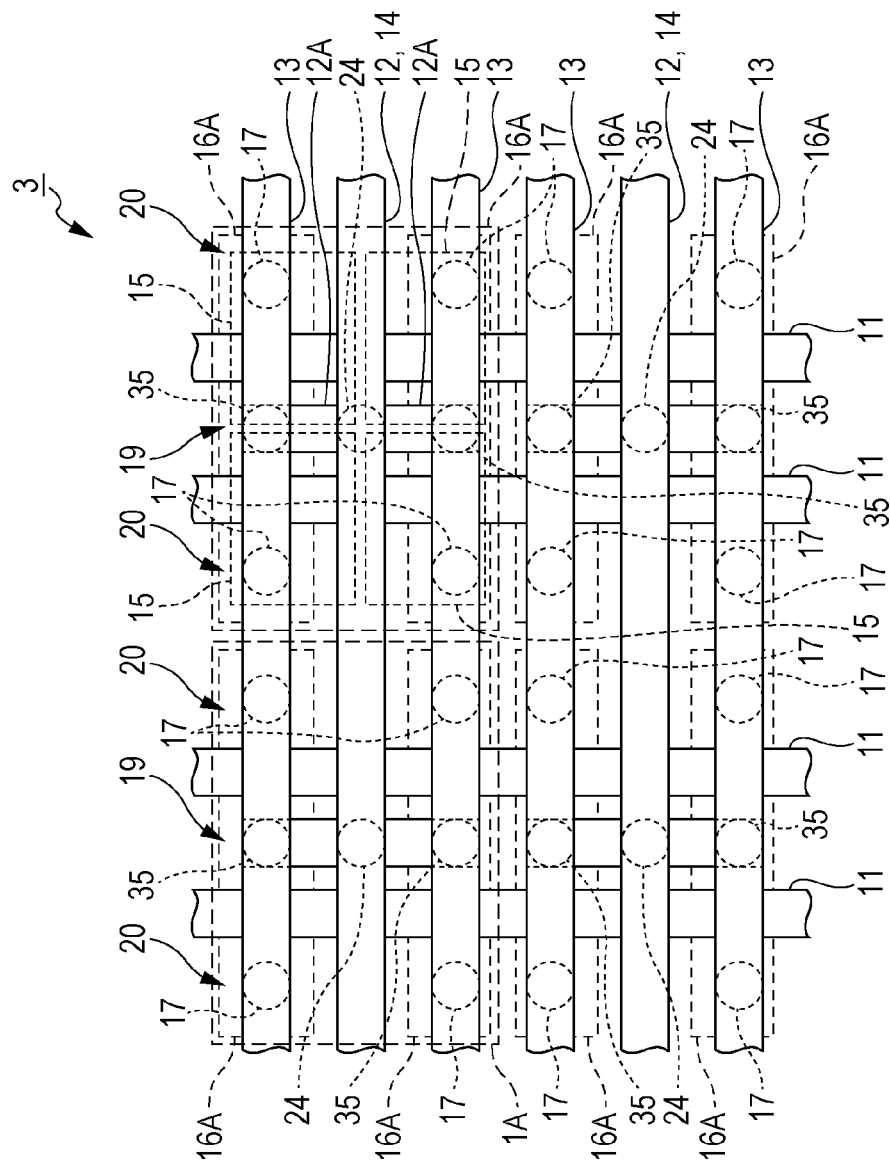

NONVOLATILE MEMORY DEVICE

BACKGROUND

1. Technical Field

The present disclosure relates to a nonvolatile memory device. In more detail, the present disclosure relates to a resistance change-type nonvolatile memory device.

2. Description of the Related Art

With resent development in digital technology, electronic apparatuses such as a portable information technology device, an information technology home appliance, etc. have been further improved in performance. Therefore, there are increasing demands for increasing the capacity, decreasing the write electric power, increasing the write/read speed, and increasing the life time of a nonvolatile memory device.

For these demands, miniaturization of a flash memory using an existing floating gate is advanced. On the other hand, development of a nonvolatile memory device (resistance change-type memory) using a resistance-change element in which a resistance value is reversibly changed by applying a voltage pulse is also advanced. This resistance change-type memory includes a memory cell which can be configured in a simple structure and is thus expected to be further miniaturized, increased in speed, and decreased in power consumption.

A memory cell which performs a memory operation has been configured by using one transistor and one memory element. Hereinafter, this memory cell may be referred to as a "1T1 R-type memory cell". Higher integration has been achieved by this memory cell.

International Publication No. 2009/008080 discloses a semiconductor device using a 1T1R-type memory cell. The semiconductor device has a configuration in which a bit line BL connected to an upper electrode of a resistance-change element crosses at a right angle a source line SL to which a lower electrode of the resistance-change element is connected through a transistor (FIG. 2 of International Publication No. 2009/008080). In the memory device, a resistance change-type element RM is connected to a n-type semiconductor region (source/drain) through a plurality of plugs and first layer wiring which extend in a vertical direction (a region z2 in FIG. 7 of International Publication No. 2009/008080).

Japanese Unexamined Patent Application Publication No. 2004-355670 discloses a nonvolatile memory device using a 1T1R-type memory cell. The memory has a configuration in which a bit line connected to one of the electrodes of a memory element and a common source line connected to the other electrode of the memory element extend in parallel (FIG. 4 of Japanese Unexamined Patent Application Publication No. 2004-355670).

A usual nonvolatile memory device has a problem that by arranging in parallel a bit line BL (wiring connected to a nonvolatile memory device) and a source line SL (wiring connected to one of the main terminals of a transistor), power consumption of writing in a selected memory element is desired to be decreased, the size of a memory cell is desired to be further decreased with a higher operation speed, or an operation is desired to be stabilized by decreasing wiring delay.

SUMMARY

One non-limiting and exemplary embodiment provides a nonvolatile memory device in which for example, by arranging in parallel a bit line BL and a source line SL, the power consumption of writing in a selected memory element is decreased, the size of a memory cell is further decreased with a higher operation speed, or an operation is stabilized by decreasing wiring delay.

In one general aspect, the techniques disclosed here feature a nonvolatile memory device includes: a pair of first wirings, above a substrate, extending in a first direction parallel to a main surface of the substrate; a second wiring extending in a second direction crossing the first direction and parallel to the main surface of the substrate, the second wiring being located farther apart from the substrate than the pair of the first wirings; a pair of third wirings extending in the second direction and being located farther apart from the substrate than the pair of the first wirings and the second wiring, the second wiring being located between the pair of the third wirings in a plan view; and a fourth wiring extending in the second direction and being located as far apart from the substrate as the pair of the third wirings, the fourth wiring being located between the pair of the third wirings in the plan view. The nonvolatile memory device has: four resistance-change elements each provided adjacent to respective four crossing areas in which each of the pair of first wirings intersects with each of the pair of third wirings in the plan view, each of the four resistance-change elements being connected to the respective pair of third wirings; and a first contact plug disposed at an intersection of two diagonals of a virtual tetragon defined by the four resistance-change elements in the plan view, the first contact plug connecting the second wiring to the fourth wiring. The nonvolatile memory device contains four transistors each including: a first main terminal electrically connected to the second wiring; a second main terminal electrically connected to the corresponding resistance-change element; and a control terminal that is connected to one of the pair of the first wirings or is configured integrally with the one of the pair of the first wirings, the first main terminal and the second main terminal being provided within the substrate. In the nonvolatile memory device, two transistors arranged in the second direction, among the four transistors, share each one first main terminal located between the pair of the first wirings in the plan view, the shared each one first main terminal being connected to the second wiring.

According to an aspect of the preset disclosure, for example, by arranging in parallel a bit line BL and a source line SL in a nonvolatile memory device, power consumption of writing in a selected memory element can be decreased, and the size of a memory cell can be further decreased with a higher operation speed. Also, an operation can be stabilized by decreasing wiring delay.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 4 is a plan view illustrating an example of a schematic configuration of a nonvolatile memory device according to a third embodiment;

Figure 1A:
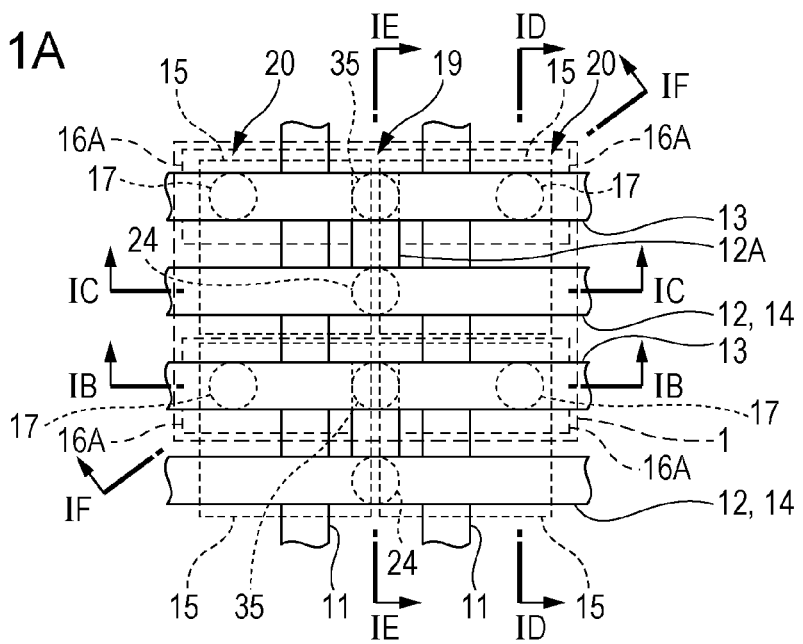
FIG. 1A is a plan view illustrating an example of a schematic configuration of a nonvolatile memory device according to a first embodiment.

DETAILED DESCRIPTION (Underlying Knowledge Forming Basis of the Present Disclosure)

The inventors performed intensive research for decreasing the power consumption of writing in a selected memory element and decreasing the size of a memory cell with a higher operation speed by arranging in parallel a bit line BL and a source line SL. As a result knowledge below was obtained.

In a configuration in which a bit line BL and a source line SL are arranged in parallel, the size of a memory cell can be decreased by, for example, decreasing the width of the source line. However, when the width of the source line is decreased, wiring resistance is increased, and an operation of a nonvolatile memory device is easily destabilized due to the occurrence of wiring delay. In order to stabilize an operation of a nonvolatile memory device by suppressing wiring delay, conversely it is necessary to increase the width of the source line. That is, the width of the source line and the wiring delay are in a trade-off relationship.

In this case, for example, it is conceivable that backing wiring is provided on the source line, and both wirings are connected through a contact plug at a predetermined distance therebetween. In this configuration, even with the source line having the same width, the wiring delay can be suppressed by decreasing the resistance of the source line. Alternatively, the width of the source line can be decreased while preventing an increase in wiring delay. However, when the source line and the backing wiring are connected through the contact plug, short-circuiting easily occurs between the contact plug and an adjacent memory element, and thus an operation is easily destabilized.

As a result of further research, a configuration has been conceived as an example, which includes a pair of word lines, a pair of bit lines, and a source line and backing wiring extending in parallel to the bit lines and which further has requirements below. The word lines three-dimensionally cross the bit lines, and four resistance-change elements are disposed corresponding to the four three-dimensional crossing positions adjacent to each other in the longitudinal direction of the word lines and the longitudinal direction of the bit lines. Further, a contact plug is disposed at the intersection of two virtual diagonals of a tetragon defined by four resistance-change elements at the vertexes constituting the respective four memory cells, and the source line and the backing wiring are connected through the contact plug.

In this configuration, the contact plug which connects the source line and the backing wiring is formed at a position farthest from each of the four adjacent resistance-change elements. Therefore, the possibility of short-circuiting between the contact plug and each of the resistance-change elements is decreased.

Next, embodiments of the present disclosure are described below with reference to the attached drawings.

In embodiments described below, a preferred example of the present disclosure is described. Numerical values, shapes, materials, components, arrangement and connection mode of the components, steps, the order of steps, etc. described in the embodiments below are merely examples and do not limit the present disclosure. Of the components in the embodiments below, components not corresponding to the most specific concept of the present disclosure are described as optional components constituting a desired aspect. Also, the components with the same reference numeral in the drawings may not be described in duplication. In addition, for the purpose of easy understanding, each of the components is schematically shown in the drawings, and shapes, dimensional ratios, and the like may not be correct indications. In a manufacturing method, if required, the order of steps can be changed, and other known steps can be added.

(First Embodiment)

A nonvolatile memory device according to a first embodiment includes: a pair of first wirings, above a substrate, extending in a first direction parallel to a main surface of the substrate: a pair of second wirings extending in a second direction crossing the first direction and parallel to the main surface of the substrate, the pair of the second wirings being located farther apart from the substrate than the pair of the first wirings; a pair of third wirings extending in the second direction and parallel to the main surface of the substrate, the pair of third wirings being located farther apart from the substrate than the pair of the first wirings and the pair of the second wirings, the pair of the second wirings and the pair of the third wirings being alternately arranged in a plan view; a pair of fourth wirings extending in the second direction and parallel to the main surface of the substrate, and being located as far apart from the substrate as the pair of the third wirings, the pair of the fourth wirings and the pair of the third wirings being alternately arranged in the plan view; four resistance-change elements each provided adjacent to respective four crossing areas in which each of the pair of first wirings intersects with each of the pair of third wirings in the plan view, each of the four resistance-change elements being connected to the respective pair of third wirings; a first contact plug disposed at an intersection of two diagonals of a virtual tetragon defined by the four resistance-change elements in the plan view, the first contact plug connecting one of the pair of the second wirings to one of the pair of the fourth wirings; a second contact plug arranged to be in a linear symmetry with the first contact plug with respect to one third wiring of the pair of third wirings in the second direction in the plan view between the other of the pair of the second wirings and the other of the pair of the fourth wirings, the second contact plug connecting the other of the pair of the second wirings to the other of the pair of the fourth wirings; and four transistors each including a first main terminal electrically connected to the one of the pair of the second wirings, a second main terminal electrically connected to the corresponding resistance-change element, and a control terminal that is connected to one of the pair of the first wirings or is configured integrally with the one of the pair of the first wirings, the first main terminal and the second main terminal being provided within the substrate, two transistors arranged in the second direction, among the four transistors, sharing one first main terminal located between the pair of the first wirings in the plan view, the shared one first main terminal being electrically connected to the first contact plug, and the other two transistors arranged in the second direction, among the four transistors, sharing another first main terminal located between the pair of the first wirings in the plan view, the shared other first main terminal being electrically connected to the second contact plug. The resistance-change element may include a lower electrode, an upper electrode, and a resistance-change layer interposed between the lower electrode and the upper electrode.

In the configuration of the nonvolatile memory device, when the second wiring and the third wirings are arranged in parallel, the power consumption of writing in a selected memory element can be decreased, and the size of each of the memory cells can be decreased with a higher operation speed. Also, the operation can be stabilized by decreasing wiring delay.

In the nonvolatile memory device according to the first embodiment, each of the resistance-change elements may be provided with a sidewall insulating layer which covers the side surface of at least the resistance-change layer.

In the configuration, the possibility of short-circuiting between the contact plug and the resistance-change layer can decreased.

In the nonvolatile memory device according to the first embodiment, the width of any one of the second wiring and the fourth wiring in a plan view may be smaller than the width of each of the four resistance-change elements.

In the configuration, the area of each of the memory cells can be further decreased by decreasing the width of the second wiring and the width of the fourth wiring.

The nonvolatile memory device according to the first embodiment may further include a second contact plug and a third contact plug which are provided between the second main terminal and the corresponding resistance-change element and which connect the second main terminal to the corresponding resistance-change element. Also, the nonvolatile memory device according to the first embodiment may further include a conductive member which is disposed between the second contact plug and the third contact plug and which connect the second contact plug to the third contact plug.

In the configuration, a connection wiring layer is not formed between the second contact plug and the third contact plug. Therefore, the distance between the third contact plug and the second wiring and can be decreased, and thus the size of the memory cells can be further decreased. Also, the contact resistance of a contact portion can be decreased.

[Configuration of Device]

Figure 1B:
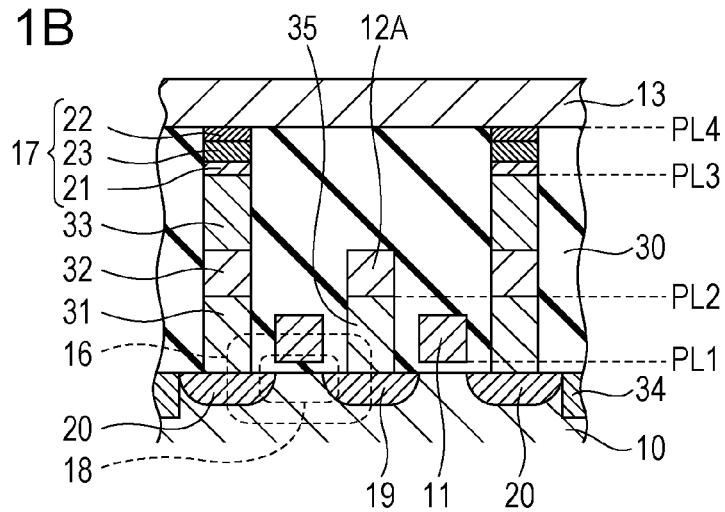
FIG. 1B is a sectional view taken along line IB-IB in FIG. 1A and illustrating an example of a schematic configuration of a nonvolatile memory device according to a first embodiment.
Figure 1C:
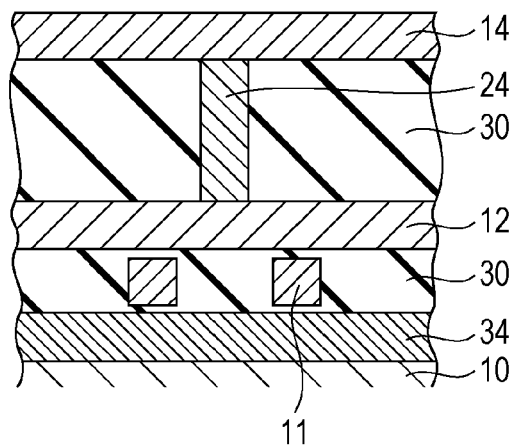
FIG. 1C is a sectional view taken along line IC-IC in FIG. 1A and illustrating an example of a schematic configuration of a nonvolatile memory device according to a first embodiment.
Figure 1D:
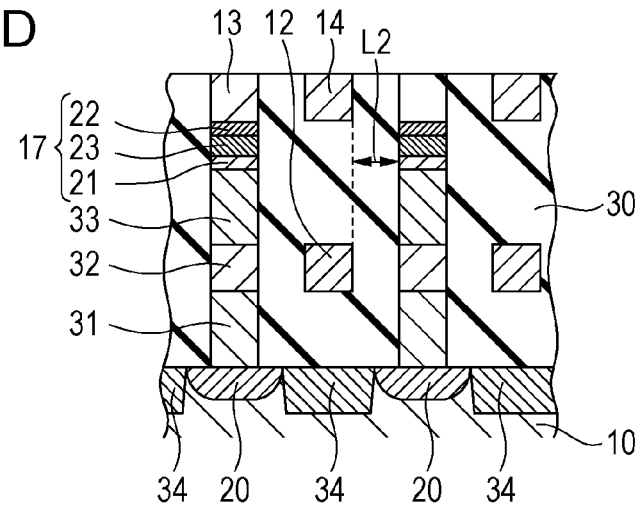
FIG. 1D is a sectional view taken along line ID-ID in FIG. 1A and illustrating an example of a schematic configuration of a nonvolatile memory device according to a first embodiment.
Figure 1E:
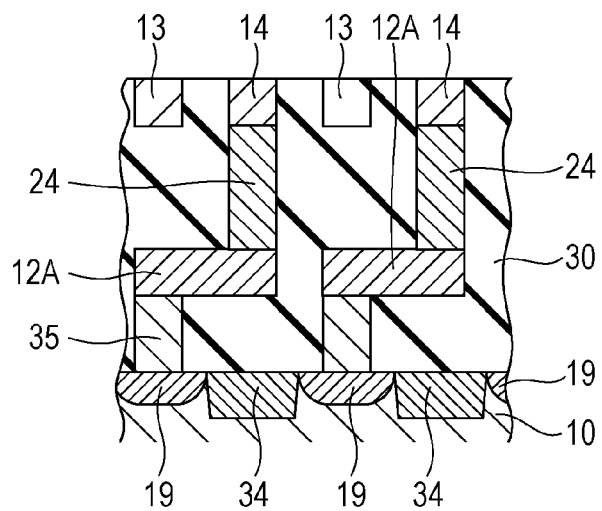
FIG. 1E is a sectional view taken along line IE-IE in FIG. 1A and illustrating an example of a schematic configuration of a nonvolatile memory device according to a first embodiment.
Figure 1F:
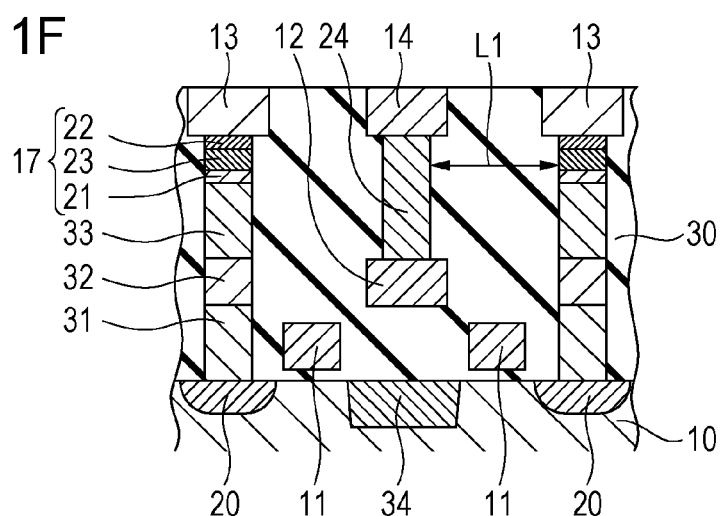
FIG. 1F is a sectional view taken along line IF-IF in FIG. 1A and illustrating an example of a schematic configuration of a nonvolatile memory device according to a first embodiment.

FIG. 1A is a plan view illustrating an example of a schematic configuration of the nonvolatile memory device according to the first embodiment. FIGS. 1B to 1F are sectional views each illustrating an example of a schematic configuration of the nonvolatile memory device according to the first embodiment. FIG. 1B is a sectional view taken along line IB-IB in FIG. 1A and viewed in an arrow direction. FIG. 1C is a sectional view taken along line IC-IC in FIG. 1A and viewed in an arrow direction. FIG. 1D is a sectional view taken along line ID-ID in FIG. 1A and viewed in an arrow direction. FIG. 1E is a sectional view taken along line IE-IE in FIG. 1A and viewed in an arrow direction. FIG. 1F is a sectional view taken along line IF-IF in FIG. 1A and viewed in an arrow direction. The nonvolatile memory device according to the first embodiment is described below with reference to FIGS. 1A to 1F (hereinafter referred to as "FIG. 1").

As shown in FIGS. 1A to 1F, a nonvolatile memory device 1 includes a substrate 10, a pair of first wirings 11, second wiring 12, a pair of third wirings 13, fourth wiring 14, and four memory cells 15. Each of the memory cells 15 includes a transistor 16 and a resistance-change element 17. The transistor 16 includes a first main terminal 19, a second main terminal 20, and a control terminal 18 (the same member as the first wirings 11 in an example shown in FIG. 1B). The resistance-change element 17 includes a lower electrode 21, an upper electrode 22, and a resistance-change layer 23.

The substrate 10 includes, for example, a silicon substrate.

The first wirings 11 extend in a first direction on a first plane PL1 parallel to a main surface of the substrate 10. The first wirings 11 are composed of, for example, polysilicon, titanium (Ti), tantalum (Ta), aluminum (Al), tungsten (W), a nitride or oxide thereof, or a laminated structure of these materials. The width of the first wirings 11 are, for example, 16 to 100 nm. In FIG. 1, the first wiring 11 is formed integrally with the control terminals 18 of the transistors 16. The first wirings 11 and the control terminals 18 may be separately formed and then connected to each other. In FIG. 1A, the first direction is the longitudinal direction of the first wiring 11.

The second wiring 12 extends in a second direction crossing the first direction on a second plane PL2 parallel to the main surface of the substrate 10 and farther from the substrate 10 than the first plane PL1. In FIG. 1A, the second direction is the longitudinal direction of the second wiring 12.

The second wiring 12 (transistor wiring) is formed in, for example, an interlayer insulating layer 30. The second wiring 12 includes an adhesive layer in contact with the interlayer insulating layer 30 and a filling layer formed inside the adhesive layer. The adhesive layer is composed of, for example, tantalum (Ta), a tantalum nitride (TaN), titanium (Ti), a titanium nitride (TiN), or ruthenium (Ru). The filling layer is composed of, for example, a material containing copper (Cu) as a main component. In FIG. 1B, the second wiring 12 is provided with a projecting portion 12A overlapping the third wirings 13 as viewed in the thickness direction of the substrate 10. The wiring width of the second wiring 12 is, for example, 20 to 120 nm. The wiring width of the second wiring 12 may be smaller than the diameter of the resistance-change elements 17 in a plan view as viewed in the thickness direction of the substrate 10. The second wiring 12 has a width of the isolation (distance from an adjacent member formed with the same mask) of 20 to 120 nm.

The third wirings 13 extend in the second direction on a fourth plane PL4 parallel to the main surface of the substrate 10 and farther from the substrate 10 than the second plane PL2. Each of the third wirings 13 is arranged to be disposed between the adjacent second wirings 12 in a plan view in the thickness direction of the substrate 10. The second wiring 12 and the third wirings 13 extend in parallel to each other.

The third wirings 13 are formed in, for example, the interlayer insulating layer 30. The third wirings 13 each include an adhesive layer in contact with the interlayer insulating layer 30 and a filling layer formed inside the adhesive layer. The adhesive layer and the filling layer can be formed with, for example, the same materials as the second wiring 12. The width of the third wirings 13 is, for example, 20 to 120 nm. The third wirings 13 have a width of isolation of 20 to 120 nm.

The fourth wiring 14 extends in the second direction on a fourth plane PL4 parallel to the main surface of the substrate 10 and is arranged to overlap the second wiring 12 in a plan view as viewed in the thickness direction of the substrate 10. The fourth wiring 14 may overlap the entire of the second wiring 12 or overlap a portion of the second wiring 12 in the plan view. The wiring width of the fourth wiring 14 may be the same as or different from that of the second wiring 12.

The fourth wiring 14 is formed in, for example, the interlayer insulating layer 30. The fourth wiring 14 includes an adhesive layer in contact with the interlayer insulating layer 30 and a filling layer formed inside the adhesive layer. The adhesive layer and the filling layer can be formed with, for example, the same materials as the second wiring 12. The wiring width of the fourth wiring 14 is, for example, 20 to 120 nm. The wiring width of the fourth wiring 14 may be smaller than the diameter of the resistance-change elements 17 in a plan view as viewed in the thickness direction of the substrate 10. The fourth wiring 14 has a minimum width of the isolation of 20 to 120 nm.

A passivation film may be formed to cover the upper end surface of the interlayer insulating layer 30, the third wiring 13, and the fourth wiring 14. The passivation film includes, for example, a silicon nitride film.

The memory cells 15 are provided corresponding to the respective four three-dimensional crossing positions of the first wirings 11 and the third wirings 13, the three-dimensional crossing positions being adjacent to each other in the first direction and the second direction. Each of the memory cells 15 includes a transistor 16 and a resistance-change element 17. The range of the memory cell 15 shown in FIG. 1A is an example, and the range of a memory area is appropriately determined.

The transistor 16 is formed on the substrate 10. For example, the transistor is formed on an active region 16A provided on the substrate 10. In FIG. 1, the transistor 16 is a MOS (metal-oxide transistor) field effect transistor (MOSFET). In FIGS. 1A and 1B, two transistors 16 are formed for one active region 16A.

The first main terminal 19 and the second main terminal 20 represent a source region and a drain region of the transistor 16. When the transistor 16 is an N-type transistor, the source region and the drain region are formed by implanting n-type impurities such as phosphorus (P), arsenic (As), or the like into a silicon substrate. When the transistor 16 is a P-type transistor, the source region and the drain region are formed by implanting P-type impurities such as boron (B), indium (In), or the like into a silicon substrate.

When one of the first main terminal 19 and the second main terminal 20 serves as a source region, the other serves as a drain region of the transistor 16. Which of the terminals serves as a source region is appropriately determined according to the type and circuit configuration of the transistor used.

A silicide may be provided in a portion of the source region and drain region. The silicide may be formed by using, for example, a compound of silicon with any one of a metal selected from the group consisting of nickel (Ni), platinum (Pt), and cobalt (Co), and an alloy of a metal selected from the group.

The control terminal 18 is electrically connected to the first wirings 11. The control terminal 18 and the first wirings 11 may be formed separately and then connected to each other or the control terminal 18 may be formed integrally with the first wirings 11. In FIG. 1, the control terminal 18 is formed integrally with the first wirings 11.

The control terminal 18 can be formed by using, for example, polysilicon, titanium (Ti), tantalum (Ta), aluminum (Al), tungsten (W), a nitride or oxide thereof, or a laminated structure of these material films. In the first embodiment, the width of the control terminal is 16 to 100 nm.

Further, a gate insulating film may be formed between the control terminal 18 and the substrate 10. For example, the gate insulating film includes a silicon oxide film or silicon oxynitride film, or a metal oxide film, for example, an oxide film of hafnium (Hf), titanium (Ti), tantalum (Ta), zirconium (Zr), lanthanum (La), aluminum (Al), or the like, and a laminated structure of these insulating films can also be used.

Further, a sidewall insulating layer may be formed on a sidewall portion of the control terminal 18. The sidewall insulating layer can be formed by using, for example, a silicon nitride film (SiN), a silicon oxide film (SiO), or a laminated film of these films. The thickness of the sidewall insulating layer is, for example, 16 to 100 nm.

The first main terminal 19 and the second main terminal 20 are disposed on both sides of the control terminal 18.

In FIG. 1, the transistor 16 is formed so that the first main terminal 19 and the second main terminal 20 included in the same transistor 16 are arranged in parallel to the second direction as viewed in the thickness direction of the substrate 10. However, the transistor 16 may be formed so that the first main terminal 19 and the second main terminal 20 included in the same transistor 16 are arranged at a right angle with the second direction. Alternatively, the transistor 16 may be formed so that the first main terminal 19 and the second main terminal 20 included in the same transistor 16 are arranged at an angle of 0° or more and 90° or less with the second direction.

For example, in FIGS. 1A and 1B, the first main terminal 19 is formed immediately below the second wiring 12, the second main terminal 20 is formed immediately below the third wiring 13, and the control terminal 18 is disposed between the first main terminal 19 and the second main terminal 20. In this case, the transistor 16 is formed obliquely with the second direction in the thickness direction of the substrate 10. In this configuration, a fourth contact plug 35 can be formed in contact with both of the first main terminal 19 and the second main terminal 20 without forming the projecting portion 12A. That is, the projecting portion 12A is not required.

Of the four transistors 16, the two transistors arranged in the second direction include the same first main terminal 19. That is, the two transistors arranged in the second direction share the same first main terminal 19, which is arranged between the two first wirings 11 in a plan view in the thickness direction of the substrate 10. That is, the one first main terminal 19 functions as a main terminal of each of the transistors 16 formed on both sides of the first main terminal 19.

The second wiring 12 is connected to at least any one of the two first main terminals 19. A connecting method is not particularly limited. In FIG. 1, the projecting portion 12A of the second wiring 12 is connected, through the fourth contact plug 35, to only one of the two first main terminals 19 adjacent to each other in the first direction in a plan view. For example, the second wiring 12 may be provided with two projecting portions 12A so as to be connected to both the two first main terminals 19 adjacent to each other in the first direction in a plan view in the thickness direction of the substrate 10.

The fourth contact plug 35 extends from the upper end surface of the first main terminal 19 to the second plane PL2 and is connected to the second wiring 12. In FIG. 1, the fourth contact plug 35 is formed to extend from the upper end surface of the first main terminal 19 to the lower surface of the projecting portion 12A. That is, the fourth contact plug 35 contacts the second wiring 12 at the lower surface of the projecting portion 12A. The fourth contact plug 35 may be in contact with a silicide formed on the upper end surface of the first main terminal 19. The diameter of the fourth contact plug 35 is, for example, 20 to 100 nm. In FIG. 1, the fourth contact plug 35 is formed to pass through the interlayer insulating layer 30. The fourth contact plug 35 connects the first main terminal 19 and the second wiring 12.

The resistance-change element 17 is disposed on the third plane PL3 which is parallel to the main surface of the substrate 10 and is farther from the substrate 10 than the second plane PL2 and nearer to the substrate 10 than the fourth plane PL4. Four resistance-change elements 17 are each provided adjacent to respective four crossing areas in which each of the pair of first wirings 11 intersects with each of the pair of third wirings 13 in the plan view. Here, "adjacent to respective four crossing areas" means that a center location of each of the four resistance-change elements 17 is arranged within 20 to 200 nm apart from a center location of each of four crossing areas. The resistance-change element 17 may have a shape close to a circular shape or square shape, a rectangular shape, or an elliptical shape as viewed in the thickness direction of the resistance-change element 17. The size (for example, the length of a side of a square shape or the diameter of a circular shape) of the resistance-change element 17 as viewed in the thickness direction thereof is, for example, 45 to 300 nm.

The lower electrode 21 is made of a lower electrode material. The standard electrode potential of the lower electrode material may be lower than the standard electrode potential of an upper electrode material constituting the upper electrode 22. The thickness of the lower electrode 21 is, for example, 5 to 100 nm.

When a tantalum oxide is used in the resistance-change layer 23 described below, examples of the lower electrode material which can be used include a tantalum nitride (TaN), a titanium nitride (TiN), tungsten (W), nickel (Ni), tantalum (Ta), titanium (Ti), aluminum (Al), and the like.

The lower electrode 21 is electrically connected to the second main terminal 20 of the transistor 16 provided in the corresponding memory cell 15. A connecting method is not particularly limited. In FIG. 1, the lower electrode 21 is connected to the second main terminal 20 through a second contact plug 31, a connection wiring layer 32, and a third contact plug 33.

The second contact plug 31 extends from the upper end surface of the second main terminal 20 to the second plane PL2. The second contact plug 31 may be in contact with a silicide formed on the upper end surface of the second main terminal 20. The diameter of the second contact plug 31 is, for example, 20 to 100 nm. In FIG. 1, the second contact plug 31 is formed to pass through the interlayer insulating layer 30 in a portion disposed below the second plane PL2.

The connection wiring layer 32 is formed in contact with the upper end surface of the second contact plug 31. The connection wiring layer 32 is formed in, for example, the interlayer insulating layer 30. The connection wiring layer 32 includes an adhesive layer in contact with the interlayer insulating layer 30 and a filling layer formed inside the adhesive layer. The adhesive layer and the filling layer can be formed by using, for example, the same materials as the second wiring 12. The width of the connection wiring layer 32 is, for example, 20 to 120 nm. The connection wiring layer 32 has a width of the isolation of 20 to 120 nm.

The third contact plug 33 extends from the upper end surface of the connection wiring layer 32 and is connected to the lower electrode 21. The second main terminal 20 is connected to the lower electrode 21 through the second contact plug 31, the connection wiring layer 32, and the third contact plug 33. The diameter of the third contact plug 33 is, for example, 20 to 100 nm.

The upper electrode 22 is connected to the third wiring 13. The upper electrode 22 is made of an upper electrode material. The standard electrode potential of the upper electrode material may be higher than the standard electrode potential of a metal contained in a metal oxide constituting the resistance-change layer 23 and the standard electrode potential of the lower electrode material constituting the lower electrode 21.

When a tantalum oxide is used as a metal oxide constituting the resistance-change layer 23, examples of the upper electrode material which can be used include iridium (Ir), platinum (Pt), palladium (Pd), gold (Au), copper (Cu), silver (Ag), and the like. The thickness of the upper electrode 22 is, for example, 5 to 100 nm.

The resistance-change layer 23 is interposed between the lower electrode 21 and the upper electrode 22. The resistance value of the resistance-change layer 23 reversibly changes based on an electric signal supplied between the lower electrode 21 and the upper electrode 22. The resistance-change layer 23 is, for example, a layer which reversibly transits between a high-resistance state and a low-resistance state according to the polarity of a voltage applied between the lower electrode 21 and the upper electrode 22. The resistance-change layer 23 may include a single metal oxide layer having a predetermined oxygen content.

The resistance-change layer 23 may include a plurality of metal oxide layers having different compositions. That is, the resistance-change layer 23 may be formed by laminating at least two layers including a first resistance-change layer connected to the lower electrode 21 and a second resistance-change layer connected to the upper electrode 22. In this case, the first resistance-change layer is composed of an oxygen-deficient first metal oxide and the second resistance-change layer is composed of a second metal oxide with a lower degree of oxygen deficiency than the first resistance-change layer. The second resistance-change layer of the resistance-change element has a fine local region formed therein, in which the degree of oxygen deficiency reversibly changes according to the electric pulse applied. The local region is considered to include a filament composed of an oxygen-defective site.

The term "degree of oxygen deficiency" represents a ratio of oxygen deficiency in a metal oxide to an amount of oxygen constituting the metal oxide with a stoichiometric composition (when a plurality of stoichiometric compositions are present, a stoichiometric composition having the highest resistance). The metal oxide with the stoichiometric composition is more stable and has higher resistance as compared with metal oxides with other compositions.

For example, when the metal is tantalum (Ta), the oxide with the stoichiometric composition defined as described above is represented by $Ta_2O_5$ and thus can be expressed by $TaO_{2.5}$. The degree of oxygen deficiency of $TaO_{2.5}$ is 0%, and the degree of oxygen deficiency of $TaO_{1.5}$ is 40% (=(2.5−1.5)/2.5). Also, an oxygen-excess metal oxide has a negative value of degree of oxygen deficiency. In the specification, the degree of oxygen deficiency is described as including a positive value, 0, and a negative value unless otherwise specified.

An oxide with a low degree of oxygen deficiency has a high resistance value because it is closer the an oxide with a stoichiometric composition, and an oxide with a high degree of oxygen deficiency has a low resistance value because it is closer to a metal constituting the oxide.

The term "oxygen content" represents a ratio of oxygen atoms to the total number of atoms. For example, the oxygen content of $Ta_2O_5$ is the ratio (O/(Ta+O)) of oxygen atoms to the total number of atoms and is 71.4 atomic %. Therefore, an oxygen-deficient tantalum oxide has an oxygen content of 0 or more and 71.4 atomic % or less. For example, when a metal constituting the first metal oxide layer is the same as a metal constituting the second metal oxide layer, the oxygen content has a correspondence relation to the degree of oxygen deficiency. That is, when the oxygen content of the second metal oxide layer is higher than that of the first metal oxide layer, the degree of oxygen deficiency of the second metal oxide layer is lower than that of the first metal oxide layer.

A metal other than tantalum may be used as the metal constituting the resistance-change layer. A transition metal or aluminum (Al) can be used as the metal constituting the resistance-change layer. Examples of the transition metal which can be used include tantalum (Ta), titanium (Ti), hafnium (Hf), zirconium (Zr), niobium (Nb), tungsten (W), nickel (Ni), and the like. Since a transition metal can take a plurality of oxidation states, different resistance states can be realized by an oxidation-reduction reaction. The thickness of the resistance-change layer 23 is, for example, 5 to 100 nm.

The resistance-change element can be carried out as a nonvolatile memory element such as ReRAM (Resistance Random Access Memory), PRAM (Parameter Random Access Memory), FeRAM (Feffoelectric Random Access Memory), MRAM (Magnetoresistive Random Access Memory), CBRAM (Conductive Bridge Random Access Memory), or the like.

Further, a sidewall insulating layer may be formed on a portion or the entire of the sidewalls of the resistance-change element 17 (the sidewall of the lower electrode 21, the sidewall of the resistance-change layer 23, and the sidewall of the upper electrode 22). The sidewall insulating layer may include, for example, a silicon nitride film, a silicon oxide film (SiOC) containing carbon, or the like. The thickness of the sidewall insulating layer is, for example 5 to 50 nm.

In FIG. 1B, the interlayer insulating layer 30 includes a silicon oxide film having a thickness of, for example, 50 to 1500 nm.

In FIGS. 1A to 1F, an element isolation region 34 (trench isolation) is formed outside the transistor 16 on the substrate 10 as viewed in the thickness direction of the substrate 10. The element isolation region 34 can be formed by, for example, filling a groove formed in the substrate 10 with a silicon oxide film.

The second wiring 12 is connected to the fourth wiring 14 through the first contact plug 24 formed at the intersection of the two virtual diagonals of a tetragon defined by the four resistance-change elements at the vertexes constituting the respective four memory cells 15 (FIGS. 1C and 1E). In this case, the intersection is not an intersection in a strict sense of the word and includes a position deviated within a range of manufacturing variations.

The second wiring 12 is connected to the fourth wiring 14 through the first contact plug 24 and both substantially function as a thick wiring line. This configuration can decrease the wiring resistance of wiring occured by the second wiring 12 and the fourth wiring 14 and can suppress wiring delay. In addition, the number of elements which can be connected together in parallel to the second wiring can be increased, thereby decreasing the area of the nonvolatile memory device.

Also, the first contact plug 24 is formed at the intersection of the two virtual diagonals of a tetragon defined by the four resistance-change elements which are adjacent to each other in the first direction and the second direction in a plan view as viewed in the thickness direction of the substrate 10, that is, at the position farthest from each of the four resistance-change elements. The horizontal distance (L1 in FIG. 1F) between the first contact plug 24 and the resistance-change element 17 is larger than the horizontal distance (L2 in FIG. 1D) when the first contact plug 24 is disposed between the two resistance-change elements 17 arranged in the first direction. Therefore, the possibility of short-circuiting between the contact plug and the memory element can be decreased, and thus the operation of the nonvolatile memory device 1 is stabilized. Also, the horizontal distance between the third wiring and the second wiring (and the fourth wiring) can be decreased, and thus the memory cell area can be decreased.

[Modified Example]

In a nonvolatile memory device of a modified example, the connection wiring layer 32 shown in FIG. 1 is omitted, and the second main terminal 20 is connected to the lower electrode 21 through the second contact plug 31 and the third contact plug 33.

Figure 2:
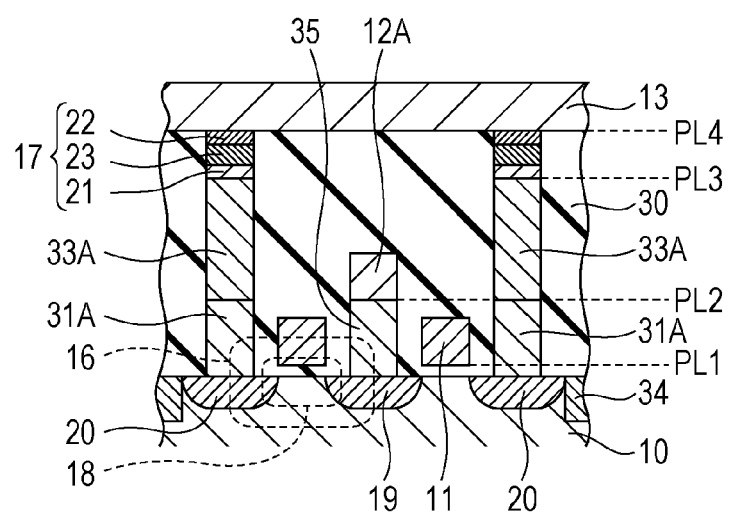
FIG. 2 is a sectional view illustrating an example of a schematic configuration of a nonvolatile memory device according to a modified example of the first embodiment.

FIG. 2 is a sectional view showing an example of a schematic configuration of a nonvolatile memory device according to a modified example of the first embodiment.

As illustrated in FIG. 2, in the nonvolatile memory device of the modified example, a second contact plug 31A extends from the upper end surface of the second main terminal 20 to the second plan PL2. A third contact plug 33A extends from the upper end surface of the second contact plug 31A and is connected to the lower electrode 21. The second main terminal 20 is connected to the lower electrode 21 through the second contact plug 31A and the third contact plug 33A.

The second contact plug 31A has the same configuration as the second contact plug 31 except that the upper end is connected to the third contact plug 33A, not the connection wiring layer 32.

The third contact plug 33A has the same configuration as the third contact plug 33 except that the lower end is connected to the second contact plug 31A, not the connection wiring layer 32.

In FIG. 2, the second contact plug 31A and the third contact plug 33A pass through the interlayer insulating layer 30. The third contact plug 33A may be formed to cover at least a portion of the upper end surface of the second contact plug 31A.

When in the interlayer insulating layer 30, a portion below the second plane PL2 and a portion above the second plane PL2 are separately formed, the third contact plug 33A may be formed to pass through a first etch stopper film formed on the portion of the interlayer insulating layer 30 below the second plane PL2.

When a fifth plane passes the upper end surface of the first wiring 11 and a portion of the interlayer insulating layer 30 below the fifth plane and a portion of the interlayer insulating layer 30 above the fifth plane are separately formed, the third contact plug 33A may be formed to pass through a second etch stopper film formed on the portion of the interlayer insulating layer 30 below the fifth plane.

Each of the second contact plug 31A and the third contact plug 33A includes an adhesive layer in contact with the interlayer insulating layer 30 and a filling layer formed inside the adhesive layer. The adhesive layer is composed of, for example, titanium (Ti), a titanium nitride (TiN), or the like. The filling layer is composed of, for example, a material containing tungsten (W) as a main component.

With the exception of the above-described points, the nonvolatile memory device of the modified example can be configured to be the same as the nonvolatile memory device according to the first embodiment. Therefore, the components common to FIGS. 1A to 1F and FIG. 2 are denoted by the same reference numeral and name and detailed description thereof is omitted.

<1> Size Of Memory Cell

In order to operate the nonvolatile memory device illustrated in FIG. 1, it is necessary to separately form (insulate) the connection wiring layer 32 and the second wiring 12. However, the connection wiring layer 32 ad the second wiring 12 are formed by patterning using the same mask in a lithographic method, and thus it is necessary to determine the width of isolation between the connection wiring layer 32 and the second wiring 12 to be larger than the minimum width determined by the wavelength of a light source used in the lithographic method. This is because when the width of isolation is smaller than the minimum width, the possibility of causing an operation defect due to contact between the connection wiring layer 32 and the second wiring 12 is increased.

For example, according to the semiconductor technology trend predicted International Technology Roadmap for Semiconductor (ITRS) in 2010, when the minimum dimension of a gate electrode in a high-performance logic device in 2010 is 27 nm, an estimated minimum value of wiring pitch corresponding to the sum of the wiring width and the width of isolation is 90 nm. Therefore, the minimum width d2 of isolation between the second wiring 12 and the connection wiring layer 32 as viewed in the thickness direction of the substrate 10 is 45 nm. This value is taken into account for the structure of the memory cell shown in FIG. 1. In the memory cell 15 shown in FIG. 1, the width in the first direction (longitudinal direction of the first wiring 11 in FIG. 1A) is 135 nm which is the sum of two wiring widths (wiring widths of the second wiring 12 and the connection wiring layer 32) and the isolation width (width of isolation between the second wiring 12 an the connection wiring layer 32).

On the other hand, in the configuration of the modified example, as shown in FIG. 2, the second contact plug 31A is directly connected to the third contact plug 33A, and the connection wiring layer 32 is not present between both. Therefore, the second wiring 12 may be isolated from the second contact plug 31A and the third contact plug 33A. The second wiring 12 and the second contact plug 31A and the third contact plug 33A are formed by using different masks. Therefore, the minimum isolation width dl may be determined to be larger than a total value of a margin of mask alignment, dimensional variation of the second wiring 12, and dimensional variation of the second contact plug 31A and the third contact plug 33A.

According to the roadmap described above, in a high-performance logic device having a minimum gate electrode dimension of 27 nm and a minimum wiring pitch of 90 nm, the minimum diameter of a contact plug is 51 nm, and the maximum overlap between different masks is 11 nm. In the case of wiring, the dimensional variation of different masks is considered to be 4.5 nm which is 10% of the minimum wiring width of 45 nm, and in the case of a contact plug, the dimensional variation of different masks is considered to be 5.1 nm which is 10% of the minimum diameter of 51 nm. Therefore, the minimum isolation width d1 between the second wiring 12 and the second contact plug 31A and the third contact plug 33A is as follows.

11 nm (maximum value of overlay between different masks)+2.25 nm (half value of dimensional variation of wiring width)+2.55 nm (half value of dimensional variation of the diameter of a contact plug)=15.8 nm Also, the width of the memory cell 15 shown in FIG. 1 in the first direction (longitudinal direction of the first wiring 11 shown in FIG. 1A) is as follows.

45 nm (minimum wiring width of the second wiring 12)+51 nm (minimum diameter of the second contact plug 31A and the third contact plug 33A)+15.8 nm (minimum width of isolation between the second wiring 12 and the second contact plug 31A and the third contact plug 33A) =111.8 nm These values are smaller than the width of isolation of 45 nm between the second wiring 12 and the connection wiring layer 32 shown in FIG. 1 and the memory cell size of 135 nm, respectively. Therefore, in the example of the configuration shown in FIG. 2, the memory cell size in the first direction can be decreased.

<2> Parasitic Resistance

In order to measure a contact resistance in the case where a connection wiring layer was omitted as in the modified example, a plurality of assemblies each including the second main terminal 20, the second contact plug 31A, the third contact plug 33A, and the lower electrode 21 were connected in series to form a test pattern. The second main terminal 20 had a depth of 200 nm, a width of 100 nm, and a thickness of 10 nm, and was composed of a compound of nickel and silicon. A laminate including the second contact plug 31A and the third contact plug 33A was connected to the upper surface of the second main terminal 20 at each of both ends thereof (front and rear ends) in the depth direction of the second main terminal 20. Specifically, the lower surface of the second contact plug 31A was connected to the upper surface of the second main terminal 20 at each of both ends (front and rear ends) in the depth direction of the second main terminal 20. The second contact plug 31A had a diameter of 40 nm and a length of 120 nm and included a laminated film of tungsten, titanium nitride, and titanium. The third contact plug 33A had a diameter of 40 nm and a length of 120 nm and included a laminated film of tungsten, titanium nitride, and titanium. The lower electrode 21 had a depth of 200 nm, a width of 100 nm, and a thickness of 50 nm, and was composed of titanium nitride. The laminate was connected to the lower surface of the lower electrode 21 at each of both ends (front and rear ends) in the depth direction of the lower electrode 21. Specifically, the upper surface of the third contact plug 33A was connected to the lower surface of the lower electrode 21 at each of both ends (front and rear ends) in the depth direction of the lower electrode 21. With the above-described configuration, 100 laminates each including the second contact plug 31A and the third contact plug 33A were connected in series through the second main terminals 20 and the lower electrodes 21 to form the test pattern. That is, the second main terminal (starting point), the laminate, the lower electrode, the laminate, the second main terminal, the laminate, . . . , the laminate, and the second main terminal (end point) were connected in series to form the test pattern. In this case, the resistance from the second main terminal serving as the starting point to the second main terminal serving as the end point was measured, and the measured resistance was regarded as the contact resistance. In the example, the number of samples was 48 (the number of the test patterned formed was 48).

On the other hand, in order to measure contact resistance when the connection wiring layer was provided, a plurality of assemblies each including the second main terminal 20, the second contact plug 31, the connection wiring layer 32, and the third contact plug 33 were connected in series to form a test pattern. The structure and material of the second main terminal 20 were the same as in the test pattern of the modified example. A laminate including the second contact plug 31, the connection wiring layer 32, and the third contact plug 33 was connected to the upper surface of the second main terminal 20 at each of both ends (front and rear ends) in the depth direction of the second main terminal 20. Specifically, the lower surface of the second contact plug 31 was connected to the upper surface of the second main terminal 20 at each of both ends (front and rear ends) in the depth direction of the second main terminal 20. The structures and materials of the second contact plug 31 and the third contact plug 33 were the same as in the test pattern of the modified example. The connection wiring layer 32 had a square shape of 80 nm×80 nm and a thickness of 100 nm and included a laminated film of copper, tantalum, and tantalum nitride. The structure and material of the lower electrode 21 were the same as in the test pattern of the modified example. The laminate was connected to the lower surface of the lower electrode 21 at each of both ends (front and rear ends) in the depth direction of the lower electrode 21. Specifically, the upper surface of the third contact plug 33 was connected to the lower surface of the lower electrode 21 at each of both ends (front and rear ends) in the depth direction of the lower electrode 21. With the above-described configuration, 100 laminates each including the second contact plug 31, the connection wiring layer 32, and the second contact plug 33 were connected in series through the second main terminals 20 and the lower electrodes 21 to form the test pattern. In this case, the resistance from the second main terminal serving as the starting point to the second main terminal serving as the end point was measured, and the measured resistance was regarded as the contact resistance. In the example, the number of samples was 48 (the number of the test patterned formed was 48).

It was found that when the upper and lower contact plugs were connected directed to each other without the connection wiring layer, the resistance value is about 20% in average lower than the resistance value when the connection wiring layer is provided between the upper and lower contact plugs.

As described above, in the configuration of the modified example, the connection wiring layer 32 is not formed, and the second contact plug 31A and the third contact plug 33A are directly connected to each other. Therefore, the contact resistance does not occur between the connection wiring layer and the second contact plug 31A and between the connection wiring layer 32 and the third contact plug 33A. Consequently, the parasitic resistance can be decreased.

In other words, the configuration of the modified example causes no increase in resistance at a contact surface between different metals, that is, between the contact plug and the connection wiring layer, and thus the contact resistance can be decreased. Therefore, it is possible to decrease variation in the voltage and current applied to the resistance-change element 17 during an operation of reading from and an operation of writing in the resistance-change element 17, thereby permitting a more stable resistance-change operation.

<3> Other Modified Example

An insulating layer may be formed on the side surface of the third contact plug 33A. The insulating layer can be formed by using silicon oxide, silicon nitride, silicon oxycarbide, or the like. The thickness of the insulating layer is, for example, about 5 nm.

When the insulating layer is formed on the side surface of the third contact plug 33A, even with a large mask overlay in a mask alignment step, contact between the second wiring 12 and the third contact plug 33A little occurs. Therefore, the minimum width of isolation (minimum width of isolation between the second wiring 12 and a contact hole in which the insulating layer and the third contact plug are formed) can be further decreased, and the memory cell size can be further effectively decreased.

(Second Embodiment)

In a nonvolatile memory device according to a second embodiment, in the nonvolatile memory device according to the first embodiment, the second wiring is connected to any one of the two first main terminals, which are adjacent to each other in the first direction in a plan view as viewed from the thickness direction of the substrate, and the third wiring and fourth wiring are alternately repeatedly arranged in a plan view. In the plan view, two fourth wirings are disposed above the second wiring which is connected to the first main terminal, and assemblies each including the two fourth wirings and two third wirings adjacent to the two fourth wirings and disposed on the first main terminal in a plan view are repeatedly arranged. In addition, a plurality of nonvolatile memory devices of the first embodiment are arranged in the second direction in correspondence to each of the assemblies.

In the configuration, wiring can be shared by a plurality of memory cells, and thus a chip area in a memory cell array with a larger capacity can be decreased.

Figure 3:
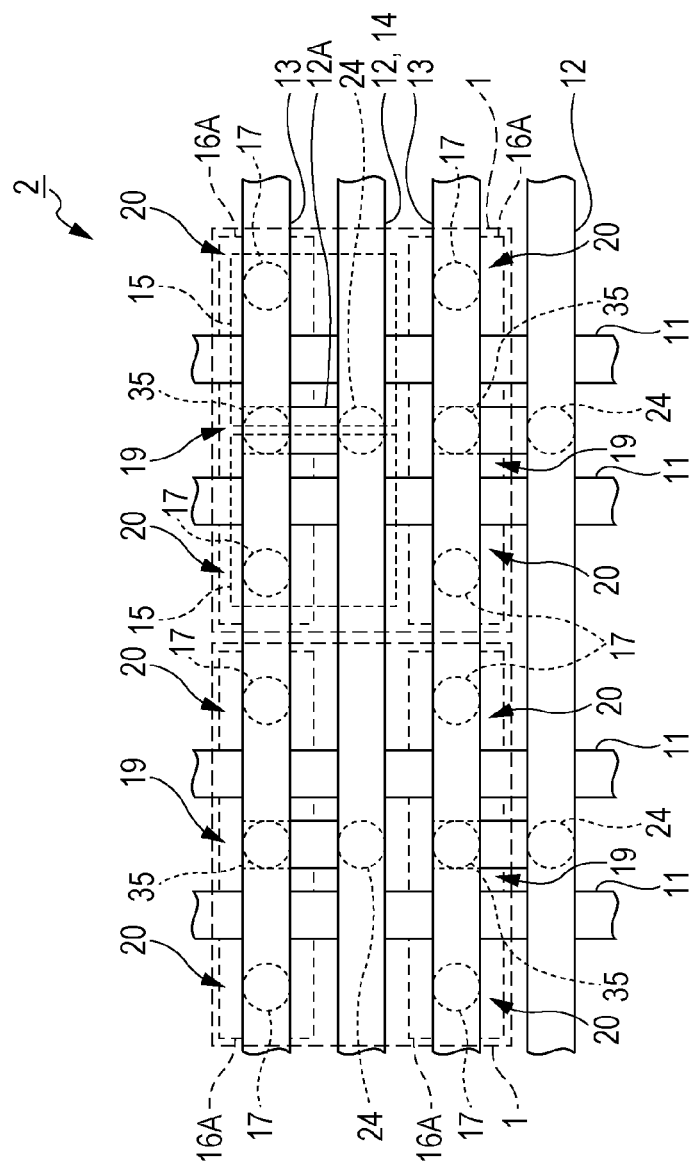
FIG. 3 is a plan view illustrating an example of a schematic configuration of a nonvolatile memory device according to a second embodiment.

FIG. 3 is a plan view showing an example of a schematic configuration of the nonvolatile memory device according to the second embodiment.

As shown in FIG. 3, in a nonvolatile memory device 2, in a plan view as viewed in the thickness direction of a substrate, the second wiring 12 is connected to one of first main terminals 19 which are adjacent to each other in the first direction, the one being shown in an upper portion of FIG. 3. In addition, the first main terminal 19 to which the second wiring 12 is connected is not particularly limited.

In a plan view as viewed in the thickness direction of the substrate, the third wirings 13 and fourth wirings 14 are alternately repeatedly arranged. The second wiring 12 is disposed below (substrate side) each of the fourth wirings 14.

In the plan view, the two fourth wirings 14 are disposed in the second direction above the second wiring 12 connected to the first main terminal 19, and the two third wirings 13 are disposed adjacent to the two fourth wirings 14 and above the first main terminal 19 in the plan view. A plurality of nonvolatile memory devices of the first embodiment are arranged in series corresponding to an assembly of the two fourth wirings 14 and the two third wirings 13.

In the configuration, the first wiring 11 is used in common by a plurality of the nonvolatile memory devices 1 arranged in the first direction, and the second wiring 12, the third wiring 13, and the fourth wiring 14 are used in common by a plurality of the nonvolatile memory devices 1 arranged in the second direction. Therefore, a chip area in a memory cell array with a larger capacity can be decreased.

The nonvolatile memory device 1 shown in FIG. 3 can be realized by the same configuration as the first embodiment, and thus detailed description thereof is omitted. In addition, in the second embodiment, the same modification as in the first embodiment can be made.

(Third Embodiment)

In a nonvolatile memory device according to a third embodiment, the second wiring is connected to two first main terminals, which are adjacent to each other in the first direction in a plan view as viewed from the thickness direction of the substrate. In the plan view, assemblies each including a pair of third wirings and one fourth wiring disposed between the pair of third wirings are repeatedly arranged.

In more detail, a nonvolatile memory device according to a second embodiment includes: a pair of first wirings, above a substrate, extending in a first direction parallel to a main surface of the substrate: a second wiring extending in a second direction crossing the first direction and parallel to the main surface of the substrate, the second wiring being located farther apart from the substrate than the pair of the first wirings; a pair of third wirings extending in the second direction and being located farther apart from the substrate than the pair of the first wirings and the second wiring, the second wiring being located between the pair of the third wirings in a plan view; a fourth wiring extending in the second direction and being located as far apart from the substrate as the pair of the third wirings, the fourth wiring being located between the pair of the third wirings in the plan view; four resistance-change elements each provided adjacent to respective four crossing areas in which each of the pair of first wirings intersects with each of the pair of third wirings in the plan view, each of the four resistance-change elements being connected to the respective pair of third wirings. The nonvolatile memory device according to a second embodiment further includes: a first contact plug disposed at an intersection of two diagonals of a virtual tetragon defined by the four resistance-change elements in the plan view, the first contact plug connecting the second wiring to the fourth wiring; and four transistors each including a first main terminal electrically connected to the second wiring, a second main terminal electrically connected to the corresponding resistance-change element, and a control terminal that is connected to one of the pair of the first wirings or is configured integrally with the one of the pair of the first wirings, the first main terminal and the second main terminal being provided within the substrate, two transistors arranged in the second direction, among the four transistors, sharing each one first main terminal located between the pair of the first wirings in the plan view, the shared each one first main terminal being connected to the second wiring.

In the configuration, wiring can be shared by a plurality of memory cells, and thus a chip area in a memory cell array with a larger capacity can be decreased. Also, the second wiring is shared by a pair of memory cells adjacent to each other in the first direction, and thus the size of a memory cell in the first direction can be further decreased.

FIG. 4 is a plan view showing an example of a schematic configuration of the nonvolatile memory device according to the third embodiment.

As shown in FIG. 4, in a nonvolatile memory device 3, in a plan view as viewed from the thickness direction of a substrate, the second wiring 12 is connected to both first main terminals 19 adjacent to each other in the first direction.

In the plan view as viewed from the thickness direction of the substrate, an assembly including a pair of third wirings 13 and fourth wiring 14 disposed between the pair of third wirings 13 is repeatedly arranged. The second wiring 12 is disposed below (substrate side) each of the fourth wirings 14. In the third embodiment, as is the case with the first embodiment, four resistance-change elements 17 are each provided adjacent to respective four crossing areas in which each of the pair of first wirings 11 intersects with each of the pair of third wirings 13 in the plan view. Here, "adjacent to respective four crossing areas" means that a center location of each of the four resistance-change elements 17 is arranged within 20 to 200 nm apart from a center location of each of four crossing areas.

In the configuration, the first wiring 11 is shared by a plurality of nonvolatile memory devices 1 arranged in the first direction, and the second wiring 12, the third wiring 13, and the fourth wiring 14 are shared by a plurality of nonvolatile memory devices 1 arranged in the second direction. Therefore, a chip area in a memory cell array with a larger capacity can be decreased.

Further, in the third embodiment, the second wiring 12 can be shared by a pair of memory cells 15 adjacent to each other in the first direction, and thus the size of a memory cell 15 in the first direction can be further decreased as compared with the second embodiment.

The nonvolatile memory device 1 shown in FIG. 4 can be realized by the same configuration as the first embodiment, and thus detailed description thereof is omitted. In addition, in the third embodiment, the same modification as in the first embodiment can be made.

Examples of the nonvolatile memory device according to each of the embodiments described above are described below with reference to the drawings.

(First Example)

Figure 5A:
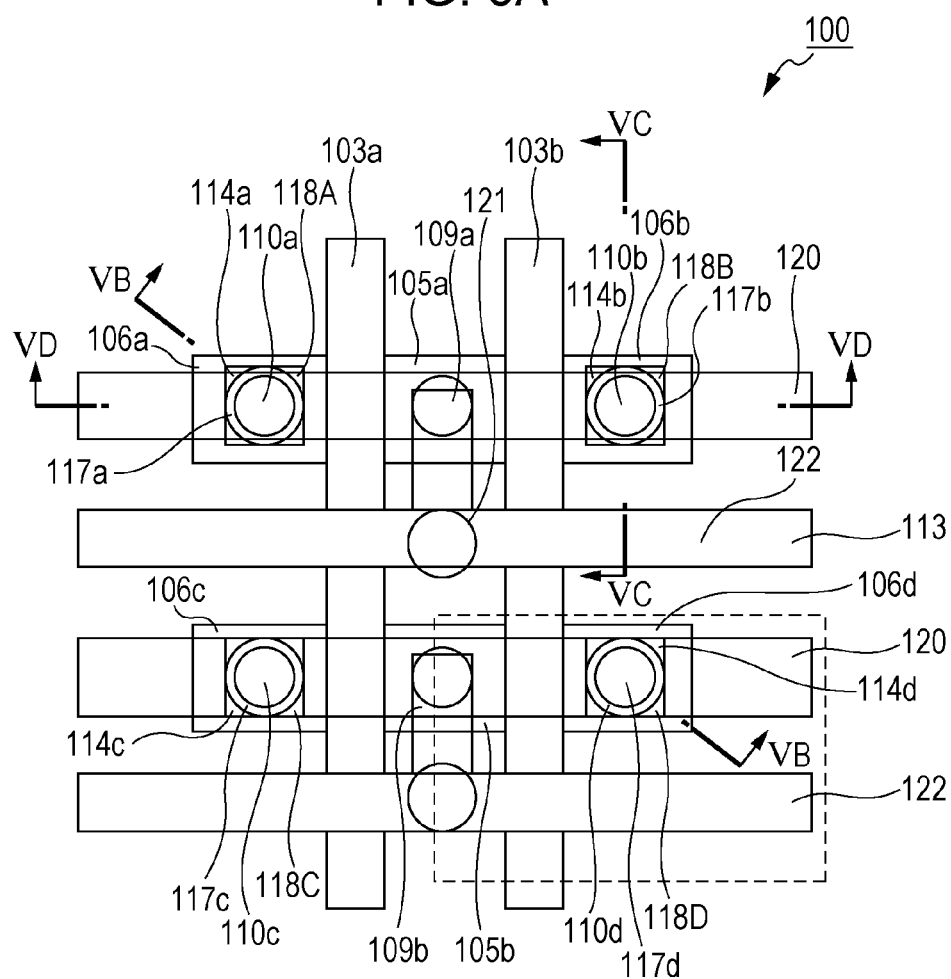
FIG. 5A is a plan view illustrating an example of a schematic configuration of a nonvolatile memory device according to a first example.
Figure 5B:
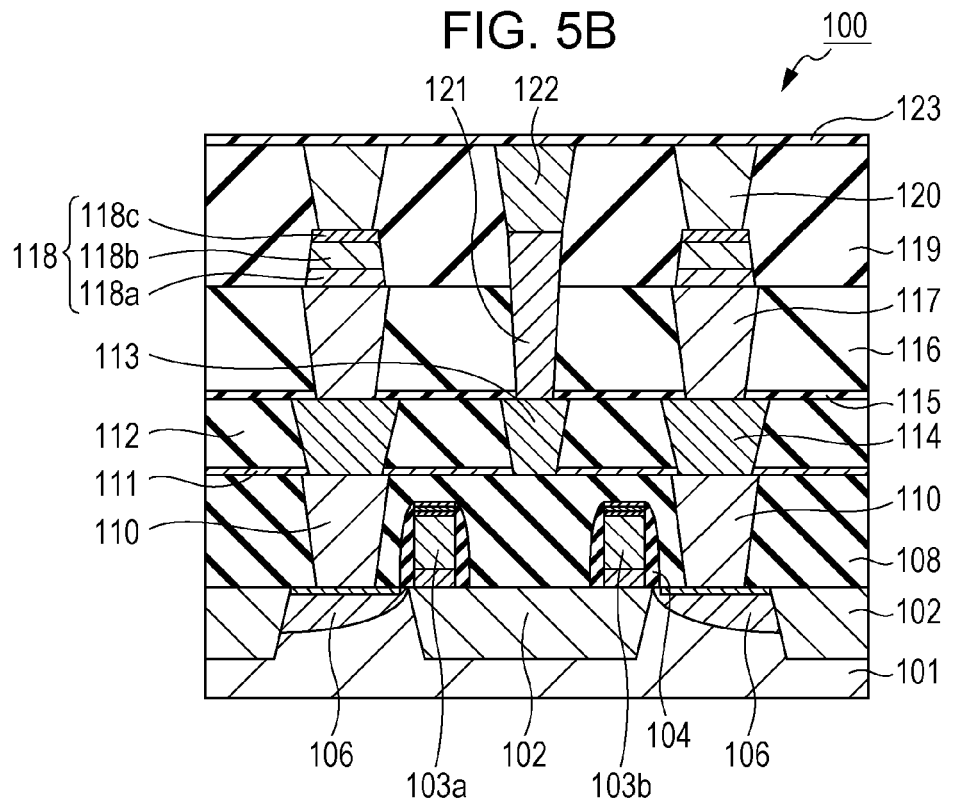
FIG. 5B is a sectional view taken along line VB-VB in FIG. 5A and illustrating an example of a schematic configuration of a nonvolatile memory device according to a first example.
Figure 5C:
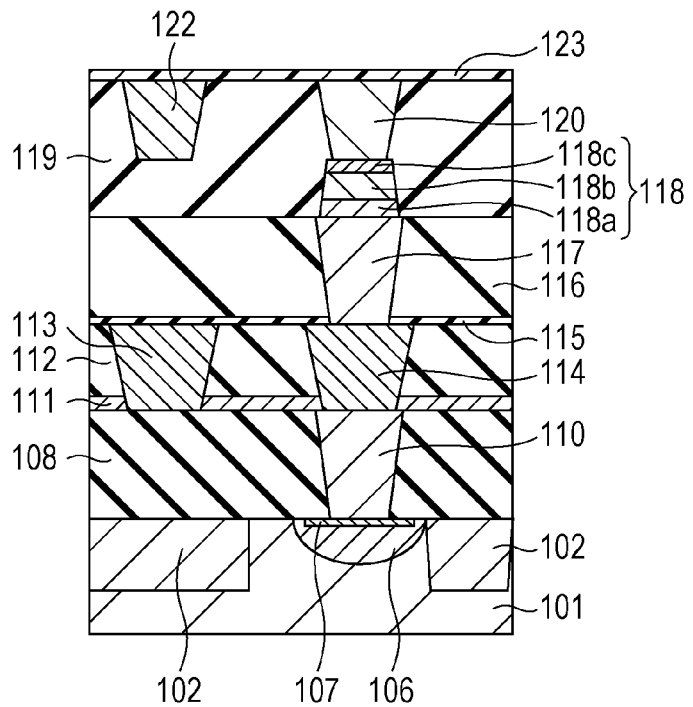
FIG. 5C is a sectional view taken along line VC-VC in FIG. 5A and illustrating an example of a schematic configuration of a nonvolatile memory device according to a first example.
Figure 5D:
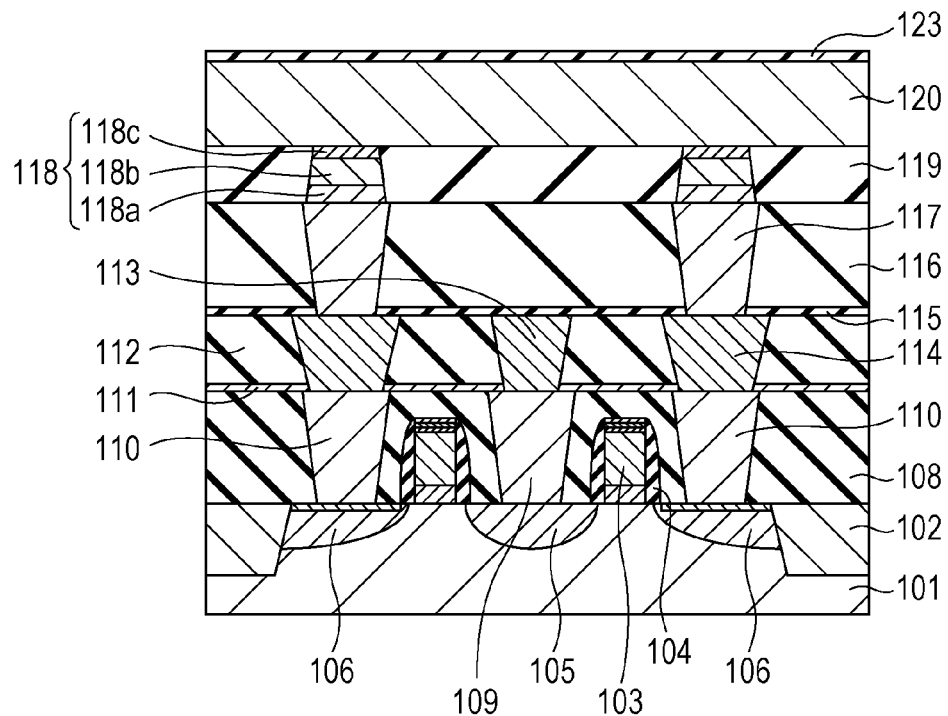
FIG. 5D is a sectional view taken along line VD-VD in FIG. 5A and illustrating an example of a schematic configuration of a nonvolatile memory device according to a first embodiment.
Figure 5E:
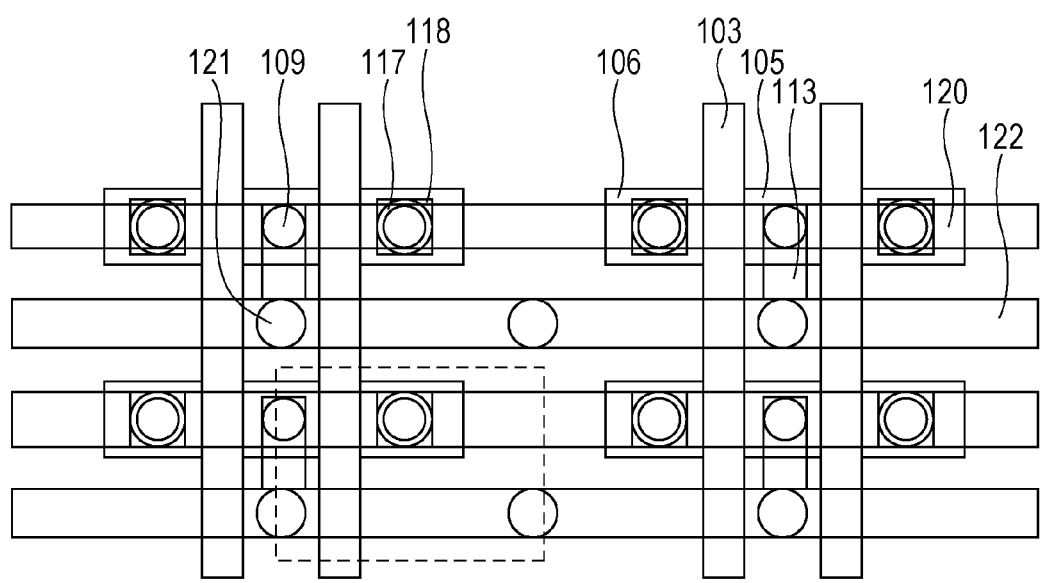
FIG. 5E is a plan view illustrating an example of a schematic configuration of a nonvolatile memory device according to a first example.

FIG. 5A is a plan view illustrating an example of a schematic configuration of a nonvolatile memory device according to a first example. FIGS. 5B, 5C, and 5D are sectional views each showing an example of a schematic configuration according to the first example. FIG. 5B is a sectional view taken along line VB-VB in FIG. 5A and viewed in an arrow direction. FIG. 5C is a sectional view taken along line VC-VC in FIG. 5A and viewed in an arrow direction. FIG. 5D is a sectional view taken along line VD-VD in FIG. 5A and viewed in an arrow direction. FIG. 5E is a plan view illustrating an example of a schematic configuration of a nonvolatile memory device according to the first example. A nonvolatile memory device 100 according to the first example is described below with reference to FIGS. 5A to 5E.

As shown in FIGS. 5A to 5E, the nonvolatile memory device includes a substrate 101, trench isolation 102, a plurality of gate electrodes 103 each including a gate insulating film and a gate conductive film, and sidewalls 104 provided on the side surfaces of the gate electrodes 103. Further, the nonvolatile memory device includes a drain region 105 used in common by two transistors, a source region 106, and a silicide 107. Further, a fourth contact plug 109 is formed in a first interlayer insulating layer 108 to be disposed on the drain region 105 and used in common by the two transistors, and a second contact plug 110 is formed on the source region 106. Further, a first etch stopper film 111 is formed on the fourth contact plug 109 and the second contact plug 110, and first transistor wiring 113 is formed in the first etch stopper film 111 and a second interlayer insulting layer 112 to be disposed on the fourth contact plug 109. Further, first element wiring 114 is formed in the first etch stopper film 111 and the second interlayer insulating layer 112 to be disposed on the second contact plug 110. Further, a third contact plug 117 is provided in a second etch stopper film 115 an a third interlayer insulating layer 116 to be in contact with a portion of the upper surface of the first element wiring 114. Further, a resistance-change element 118 is provided in contact with a portion of the upper portion of the third contact plug 117. The resistance-change element 118 includes a first electrode 118a, a resistance-change layer 118b, and a second electrode 118c. Further, a fourth interlayer insulating layer 119 is formed between respective resistance-change elements 118 and above the resistance-change elements 118, and second element wiring 120 is formed in the fourth interlayer insulating layer 119. Further, a first contact plug 121 connected to the first transistor wiring 113 is formed in the third interlayer insulating layer 116 and the fourth interlayer insulating layer 119. Further, second transistor wiring 122 connected to the first contact plug 121 and the second element wiring 120 are formed in the fourth interlayer insulating layer 119. Further, a passivation film 123 is formed on the second transistor wiring 122.

In further detail, in this example, the substrate 101 is a silicon substrate. The trench isolation is, for example, filled with a silicon oxide film and buried in a groove formed on the substrate 101.

The gate insulating film includes a silicon oxide film or silicon oxynitride film, or a metal oxide film, for example, an oxide film of hafnium (Hf), titanium (Ti), tantalum (Ta), zirconium (Zr), lanthanum (La), aluminum (Al), or the like, and a laminated structure of these insulating films can also be used.

The gate conductive film can be formed by using, for example, polysilicon, titanium (Ti), tantalum (Ta), aluminum (Al), tungsten (W), a nitride or oxide thereof, or a laminated structure of these films. In this example, the width of the gate electrode 103 is 16 nm to 100 nm.

The gate sidewalls 104 can be formed by using, for example, a silicon nitride (SiN), a silicon oxide (SiO), or a laminated film thereof. In this example, the width of the gate sidewalls 104 is 16 nm to 100 nm.

In the case of a N-type transistor, the drain region 105 and the source region 106 are implanted with a n-type impurity, for example, phosphorus (P), arsenic (As), or the like. In the case of a P-type transistor, the drain region 105 and the source region 106 are implanted with a p-type impurity, for example, boron (B), indium (In), or the like.

The silicide 107 is formed in a portion of the drain region 105 and the source region 106, and is formed by using, for example, a compound of silicon with nickel (Ni), platinum (Pt), cobalt (Co), or an alloy of the metal.

The first interlayer insulating layer 108 covers the substrate 101, the trench isolation 102, the gate electrodes 103, the drain region 105, and the source region 106. In this example, the first interlayer insulating layer 108 includes a silicon oxide film having a thickness of 300 to 500 nm.

Each of the fourth contact plug 109 and the second contact plug 110 includes a contact adhesive layer in contact with a portion of the first interlayer insulating layer 108 and a contact metal formed inside of the contact adhesive layer. In this example, the contact adhesive layer is composed of titanium (Ti) and a titanium nitride (TiN), and the contact metal is composed of a material containing tungsten (W) as a main component. The fourth contact plug 109 is connected to the drain region 105 through the silicide 107. The second contact plug 110 is connected to the source region 106 through the silicide 107. The diameter of each of the fourth contact plug 109 and the second contact plug 110 is 20 nm to 100 nm.

In this example, the second interlayer insulating layer 112 includes a silicon oxide film having a thickness of 50 nm to 300 nm.

The first transistor wiring 113 and the first element wiring 114 are formed in the second interlayer insulating layer 112 and each include a wiring adhesive layer in contact with the second interlayer insulating layer 112 and a wiring metal formed inside the wiring adhesive layer. The wiring adhesive layer is composed of, for example, tantalum (Ta), a tantalum nitride (TaN), titanium (Ti), a titanium nitride (TiN), or ruthenium (Ru). The wiring metal is composed of a material containing copper (Cu) as a main component. The first transistor wiring 113 is physically connected to the fourth contact plug 109. Also, the wiring width of the first transistor wiring 113 is 20 to 120 nm, and the width of isolation is 20 to 120 nm.

In this example, the third interlayer insulating layer 116 includes a silicon oxide film having a thickness of 50 nm to 150 nm.

Like the first contact plug and the second contact plug, the third contact plug 117 includes a contact adhesive layer and a contact metal, and the constituting materials thereof are also the same as the first contact plug and the second contact plug. The third contact plug 117 passes through the third interlayer insulating layer 116 and the second etch stopper film 115. The third contact plug 117 covers a portion of the first element wiring 114. The diameter of the third contact plug 117 is 20 nm to 100 nm.

The first electrode 118a constituting the resistance-change element 118 is composed of a first electrode material having a lower standard electrode potential than that of a second electrode material constituting the second electrode 118c described below. In this example, the thickness of the first electrode 118a is 5 nm to 100 nm. When a tantalum oxide is used for the resistance-change layer 118b described below, for example, a tantalum nitride (TaN), tungsten (W), nickel (Ni), tantalum (Ta), titanium (Ti), aluminum (Al), or the like can be used as the first electrode material.

The resistance-change layer 118b constituting the resistance-change element 118 is formed on the first electrode 118a.

In this example, the resistance-change layer 118b is composed of a transition metal oxide and has a thickness of 5 to 100 nm. The transition metal oxide is preferably at least one selected from the group consisting of a tantalum oxide, a hafnium oxide, and a zirconium oxide. In this example, the thickness of the second electrode 118c is 5 nm to 100 nm.

The size (size of one side) of the resistance-change element 118 is 45 to 300 nm. The shape of the resistance-change element 118 is not limited to a shape close to a circle and a square, and may be a rectangular shape or an elliptical shape.

In this example, the fourth interlayer insulating layer 119 covers the resistance-change element 118 and includes a silicon oxide film having a thickness of 200 nm to 500 nm.

The second element wiring 120 is formed in the fourth interlayer insulating layer 119 and is connected to the resistance-change element 118. The second transistor wiring 122 is formed in the fourth interlayer insulating layer 119. Like the first transistor wiring 113 and the first element wiring 114, each of the second element wiring 120 and the second transistor wiring 122 includes a wiring adhesive layer and a wiring metal, and the constituting materials thereof are also the same as the first wirings. The second element wiring 120 is connected to the second electrode 118c of the resistance-change element 118. Also, as shown in FIGS. 5A to 5E, the second transistor wiring 122 is connected to the first transistor wiring 113 through the first contact plug 121. The line width of each of the second element wiring 120 and the second transistor wiring 122 is 20 to 120 nm, and the width of isolation is 20 to 120 nm.

The first contact plug 121 includes a contact adhesive layer and a contact metal formed inside of the contact adhesive layer. The contact adhesive layer is composed of the same material as the wiring adhesive layers provided in the first transistor wiring 113, the first element wiring 114, the second element wiring 120, and the second transistor wiring 122. The contact metal is composed of the same material as the wiring metal provided in the first transistor wiring 113, the first element wiring 114, the second element wiring 120, and the second transistor wiring 122. The diameter of the first contact plug 121 is 20 to 100 nm.

The passivation film 123 is formed by, for example, using a silicon nitride film so as to cover the second element wiring 120 and the second transistor wiring 122.

As shown in FIG. 5B, the first transistor wiring 113 is connected to the second transistor wiring 122 through the first contact plug 121, and thus substantially the same effect as being achieved by widening wiring can be obtained. As a result, the combined resistance of the first transistor wiring 113 and the second transistor wiring 122 is lower than that in use of the first transistor wiring 113 alone and use of the second transistor wiring 122 alone. Therefore, it is possible to decrease variations in the voltage and current applied to the resistance-change element 118 during an operation of reading from and an operation of writing in the resistance-change element 118, thereby permitting a more stable resistance-change operation.

As shown in FIG. 5A, in virtually considering a tetragon defined by four resistance-change elements 118A, 118B, 118C, and 118D which are adjacent to the first contact plug 121 and are located at the vertexes of the tetragon in a plan view as viewed from the thickness direction of the substrate, the first contact plug 121 is disposed at the intersection (center) of the two diagonals of the tetragon. The center does not strictly represent the center, but substantially represents a center including a position deviated within a range of variations in manufacturing. In this configuration, even when the first contact plug 121 is formed with deviation from the positions of the resistance-change elements 118A, 118B, 118C, and 118D within a range of variations in manufacturing, the first contact plug 121 little comes in contact with the four resistance-change elements 118A, 118B, 118C, and 118D described above. Thus, an operation defect little occurs in a circuit, thereby permitting a more stable resistance-change operation.

FIG. 5E is a plan view showing an example of a configuration of a memory array of nonvolatile memory devices 100 according to the first example. In FIG. 5E, a region surrounded by a dotted line corresponds to a memory cell (one unit) of the nonvolatile memory device 100.

As shown in FIG. 5E, the gate electrodes 103 of the transistor are formed in common to a plurality of memory cells. Also, the drain region 105 is formed in common to adjacent memory cells, and the source region 106 is independently formed for each of the memory cells.

The fourth contact plug 109 formed on the drain region 105 is shared by adjacent memory cells. The second contact plug 110 formed on the source region 106 is independently for each of the memory cells.

The first transistor wiring 113 is formed in common to a plurality of memory cells and is connected to a plurality of fourth contact plugs 109.

The third contact plug 117 is connected to the first element wiring 114 and is independently formed for each of the memory cells.

The resistance-change element 118 including the first electrode 118a, the resistance-change layer 118b, and the second electrode 118c is connected to the third contact plug 117 and is independently formed for each of the memory cells.

The second element wiring 120 is formed in common to a plurality of memory cells and is connected to a plurality of resistance-change elements 118.

The memory array is characterized in that the drain region 105 and the fourth contact plug 109 are shared by the adjacent memory cells, and the first transistor wiring 113, the second element wiring 120, and the second transistor wiring 122 are shared by a plurality of memory cells arranged in the lateral direction of FIG. 5E. The area of memory cells can be decreased according to sharing, thereby causing an advantage for reducing the size of the memory cells.

[Manufacturing Method]

Next, a method for manufacturing the nonvolatile memory device according to the first example is described.

FIGS. 6A to 6H are schematic sectional views each showing a step of a method for manufacturing the nonvolatile memory device shown in FIGS. 5A to 5E. All of FIGS. 6A to 6H show sections corresponding to FIG. 5B.

Figure 6A:
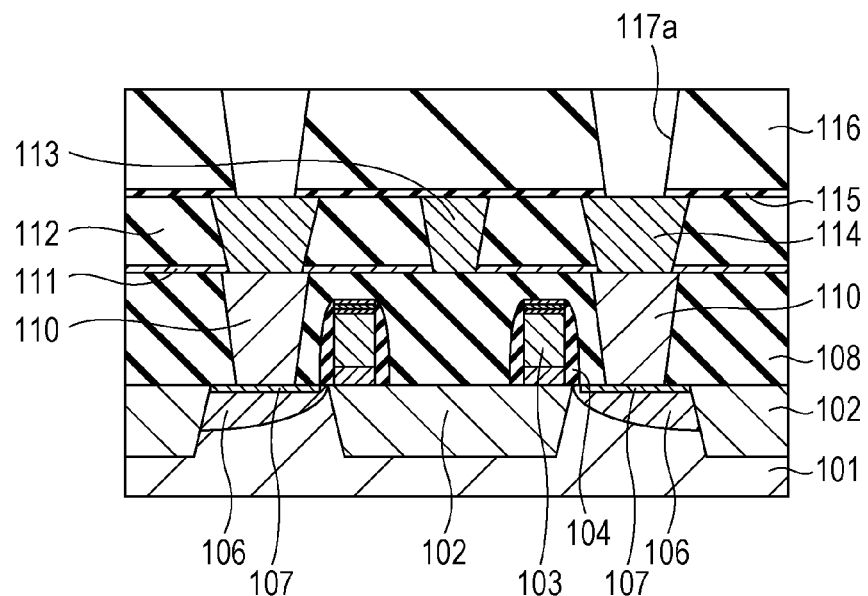
FIG. 6A is a schematic sectional view illustrating a step of a method for manufacturing the nonvolatile memory device shown in FIGS. 5A to 5E.

First, as shown in FIG. 6A, the trench isolation 102, the gate electrodes 103, the gate sidewalls 104, the drain region 105 (refer to FIG. 5D), the source region 106, the silicide 107, the first interlayer insulating layer 108, the fourth contact plug 109 (refer to FIG. 5D), the second contact plug 110, the first etch stopper film 111, and the second interlayer insulating layer 112 are formed on the substrate 101. Next, the first transistor wiring 113 and the first element wiring 114 are formed.

Specifically, the first transistor wiring 113 and the first element wiring 114 are formed by dry etching with a desired mask to provide a groove with a desired shape in a portion of the second interlayer insulating layer 112 and the etch stopper film 111. Then, a tantalum nitride film having a thickness of 5 nm and a tantalum film having a thickness of 5 nm are deposited by an atomic layer deposition (ALD) method to form a wiring adhesive layer. Then, copper (Cu) is deposited to a thickness of 300 nm on the wiring adhesive layer by an electroplating method to form a wiring metal. Then, the wiring adhesive layer and wiring metal deposited on the upper surface of the second interlayer insulating layer 112 are removed by chemical mechanical polishing (CMP) to form the first transistor wiring 113 and the first element wiring 114.

Each of the first transistor wiring 113 and the first element wiring 114, for example, has a width of 45 nm and a thickness of 80 nm.

Then, the second etch stopper film 115 composed of silicon oxycarbide (SiCO) and having a thickness of 20 nm and the third interlayer insulating layer 116 mainly composed of silicon oxide of 50 nm are deposited so as to cover the first transistor wiring 113 and the first element wiring 114.

Then, a third contact hole 117a is formed by a lithographic method and a dry etching method so as to pass through the third interlayer insulating layer 116 and the second etch stopper film 115 and to partially expose the upper surface of the first element wiring 114. The diameter of the third contact hole 117a is 40 nm.

Figure 6B:
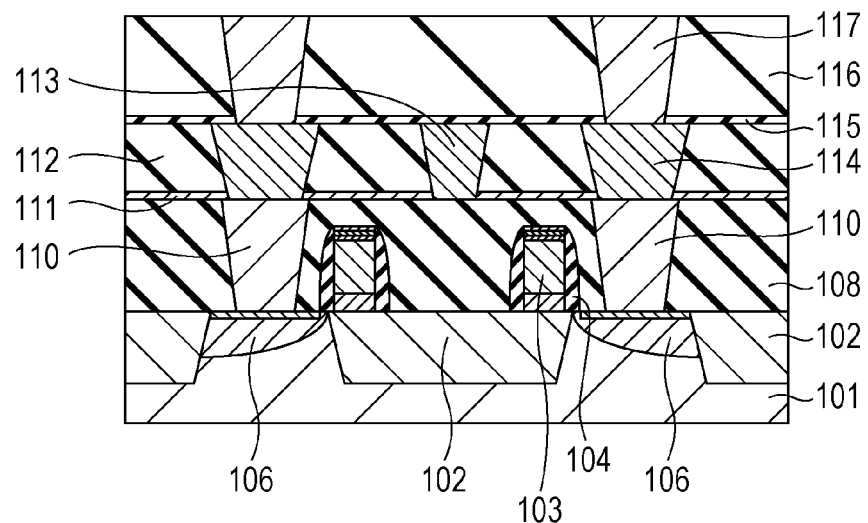
FIG. 6B is a schematic sectional view illustrating a step of a method for manufacturing the nonvolatile memory device shown in FIGS. 5A to 5E.

Then, as shown in FIG. 6B, a contact adhesive layer including a titanium nitride film (TiN) having a thickness of 5 nm and a titanium film having a thickness of 5 nm is deposited in the third contact hole 117a by a ALD method. Similarly, tungsten used as a contact metal is deposited to 300 nm by the ALD method. Then, the contact adhesive layer and the contact metal deposited on the third interlayer insulating layer 116 are removed by chemical mechanical polishing (CMP) to form the third contact plug 117.

Figure 6C:
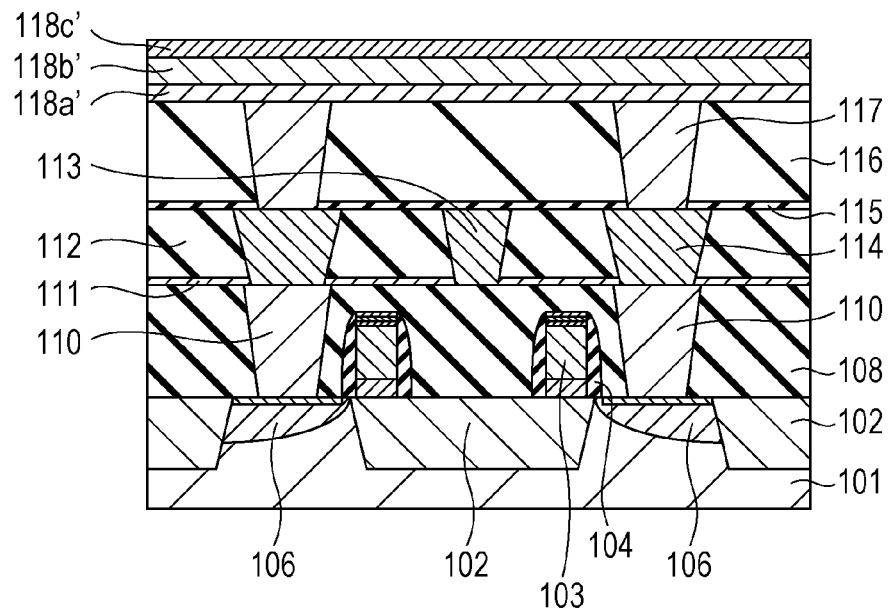
FIG. 6C is a schematic sectional view illustrating a step of a method for manufacturing the nonvolatile memory device shown in FIGS. 5A to 5E.

Then, as shown in FIG. 6C, a first electrode layer 118a', a resistance-change material layer 118b', and a second electrode layer 118c' are deposited to cover at least a portion of the third contact plug 117.

Specifically, first, for example, a tantalum nitride (TaN) having a thickness of 5 to 20 nm is deposited by a sputtering method to form the first electrode layer 118a'. A CVD (Chemical Vapor Deposition) method or an ALD method other than the sputtering method may be used.

Then, the resistance-change material layer 118b' having a thickness of 10 to 50 nm is formed by a reactive sputtering method of sputtering in an atmosphere containing oxygen by using a tantalum target.

Then, the second electrode layer 118c' is formed on the resistance-change material layer 118b'. Specifically, iridium is deposited to a thickness of 10 to 60 nm on the surface of the resistance-change material layer 118b' by a sputtering method.

Figure 6D:
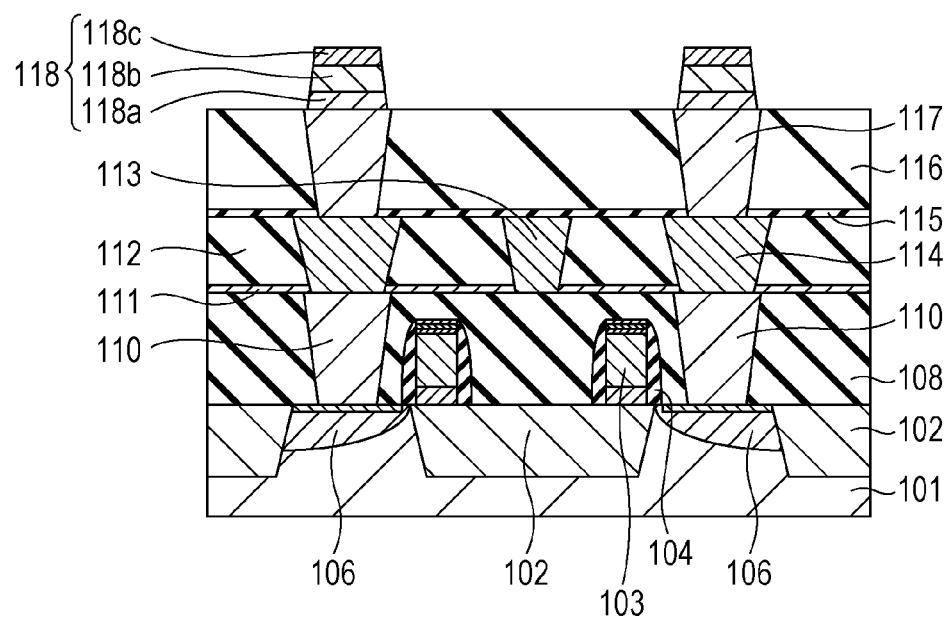
FIG. 6D is a schematic sectional view illustrating a step of a method for manufacturing the nonvolatile memory device shown in FIGS. 5A to 5E.

Then, as shown in FIG. 6D, the first electrode layer 118a', the resistance-change material layer 118b', and the second electrode layer 118c' are patterned by dry etching using a desired mask. As a result, the resistance-change element 118 including the first electrode layer 118a, the resistance-change layer 118b, and the second electrode layer 118c is formed.

Figure 6E:
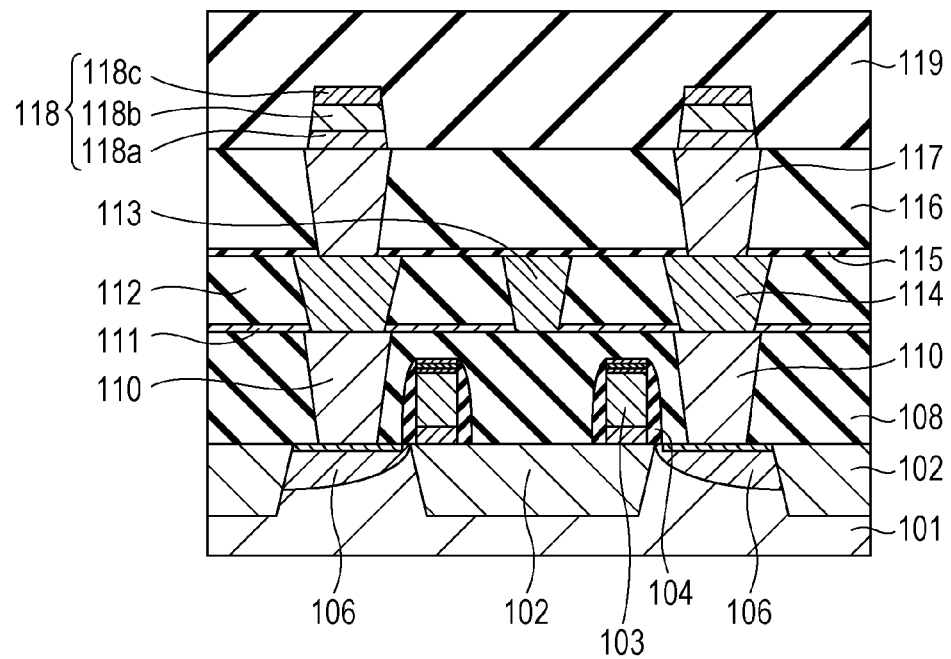
FIG. 6E is a schematic sectional view illustrating a step of a method for manufacturing the nonvolatile memory device shown in FIGS. 5A to 5E.

Then, as shown in FIG. 6E, the fourth interlayer insulating layer 119 having a thickness of 500 nm and mainly composed of silicon oxide is deposited and then planarized by the CMP method.

Figure 6F:
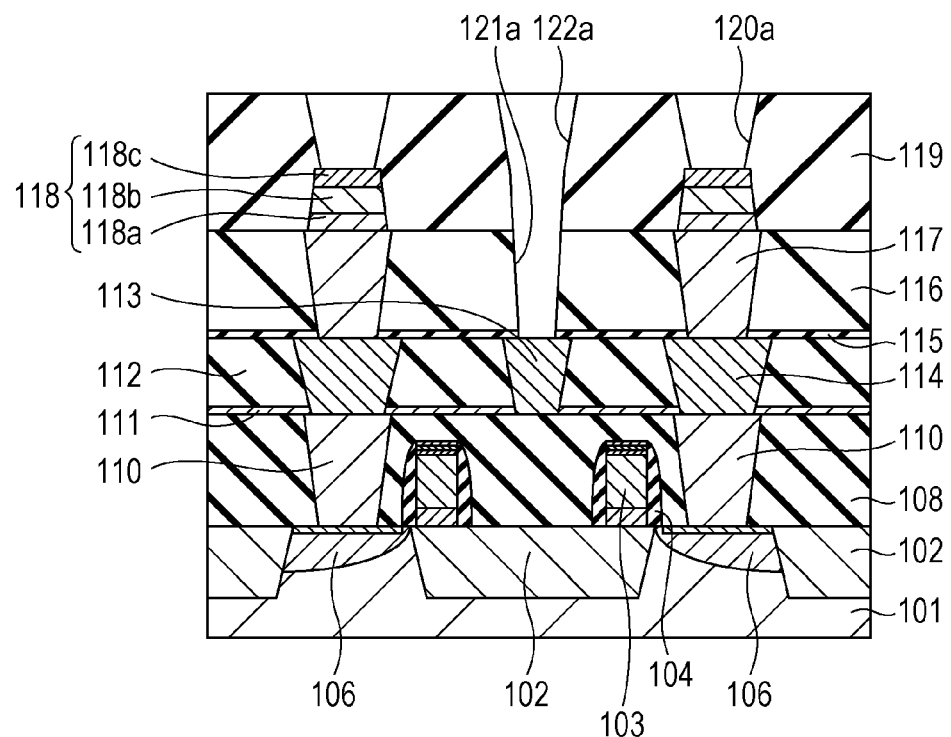
FIG. 6F is a schematic sectional view illustrating a step of a method for manufacturing the nonvolatile memory device shown in FIGS. 5A to 5E.

Then, as shown in FIG. 6F, a first contact hole 121a is provided by placing a desired mask on the fourth interlayer insulating layer 119 and dry etching so as to expose the first transistor wiring 113. Then, a third trench 120a is formed by dry etching using another mask so as to expose the second electrode 118c of the resistance-change element 118. At the same time, a fourth trench 122a is formed in a desired shape to overlap the first contact hole 121a.

Figure 6G:
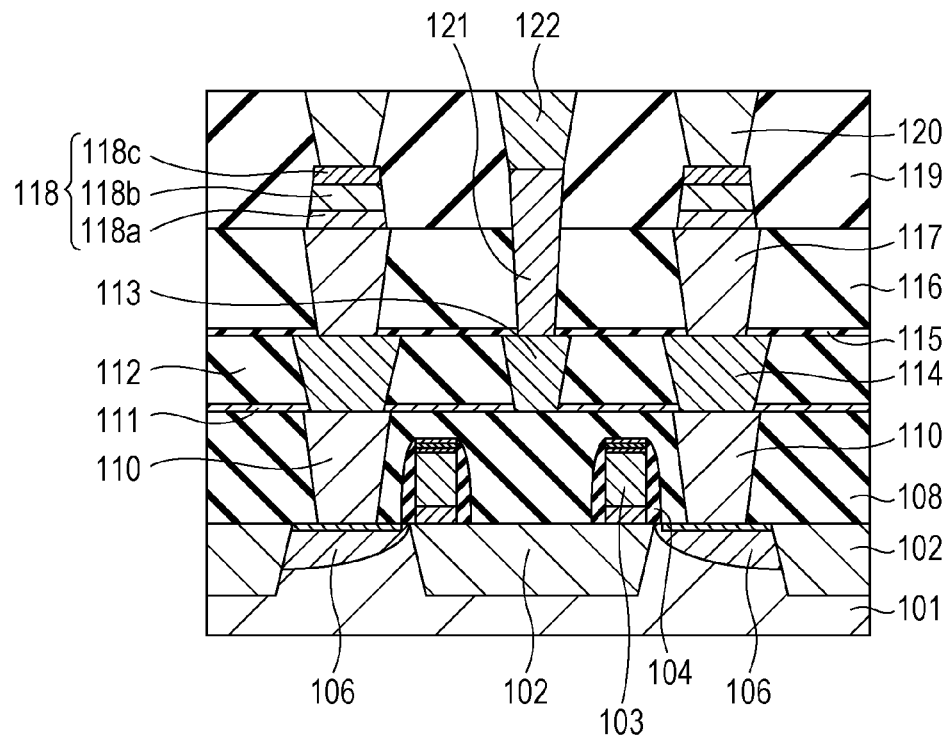
FIG. 6G is a schematic sectional view illustrating a step of a method for manufacturing the nonvolatile memory device shown in FIGS. 5A to 5E.

Then, as shown in FIG. 6G, a wiring adhesive layer including a tantalum nitride film with a thickness of 5 nm and a tantalum film with a thickness of 5 nm is deposited by the ALD (Atomic Layer Deposition) method. Then, a wiring metal having a thickness of 300 nm and composed of copper (Cu) is deposited by an electroplating method. Then, the wiring adhesive layer and the wiring metal deposited on the upper surface of the fourth interlayer insulating layer 119 are removed by chemical mechanical polishing (CMP) to form the second element wiring 120, the first contact plug 121, and the second transistor wiring 122.

Each of the second element wiring 120 and the second transistor wiring 122 has, for example, a width of 45 nm and a thickness of 80 nm. The diameter of the first contact plug 121 is, for example, 40 nm.

Figure 6H:
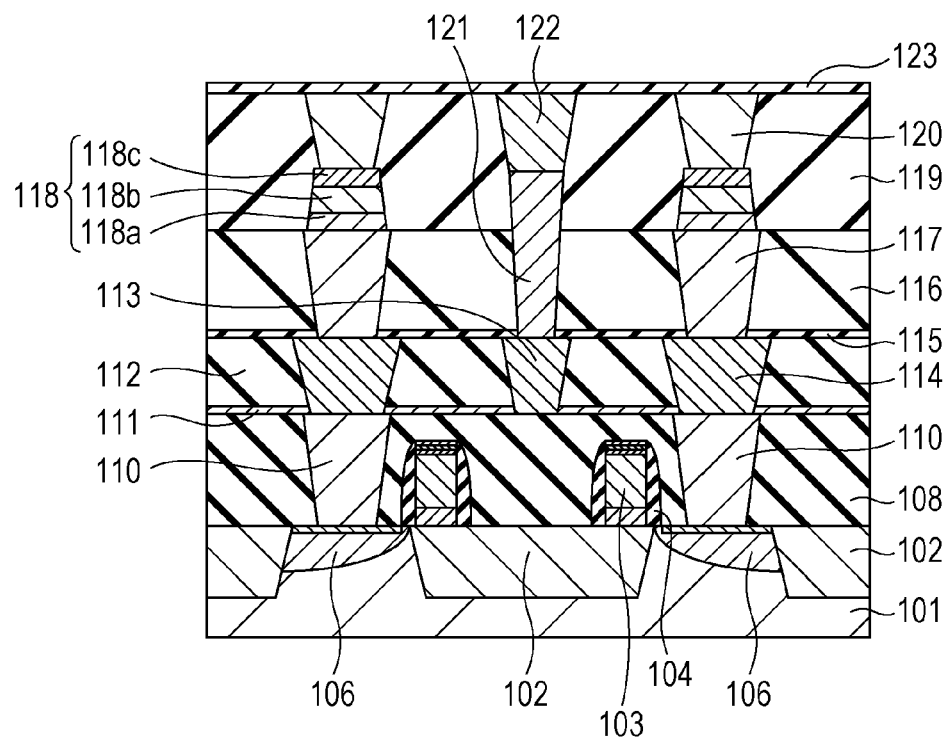
FIG. 6H is a schematic sectional view illustrating a step of a method for manufacturing the nonvolatile memory device shown in FIGS. 5A to 5E.

Then, as shown inn FIG. 6H, the passivation film 123 including, for example, a silicon nitride film having a thickness of 300 nm is deposited on the fourth interlayer insulating layer 119, the second element wiring 120, and the second transistor wiring 122.

Although, in the first example, the method of forming each of the layers and then pattering the layers is described as the method for manufacturing the nonvolatile memory device, the manufacturing method is not limited to this. The nonvolatile memory device may be formed by, for example, sequentially forming layers in a though hole formed in an interlayer insulating layer or forming some of a plurality of layers outside a through hole and forming some of the layers in the through hole.

Also, in the first example, the case in which the resistance-change layer 118b includes a single layer is described, but the resistance-change layer 118b may be formed in a laminated structure including a plurality of layers having different concentrations, compositions, or the like.

Further, a resistance-change layer composed of a transition metal oxide having an oxygen content different from that of the transition metal oxide constituting the resistance-change layer 118b may be formed between the first electrode 118a and the resistance-change layer 118b. The nonvolatile memory device according to the first example may be carried out as a nonvolatile memory device such as ReRAM or the like.

In the first example, the same modification as described in the first embodiment and the second embodiment can be made.

Second Example

Figure 7:
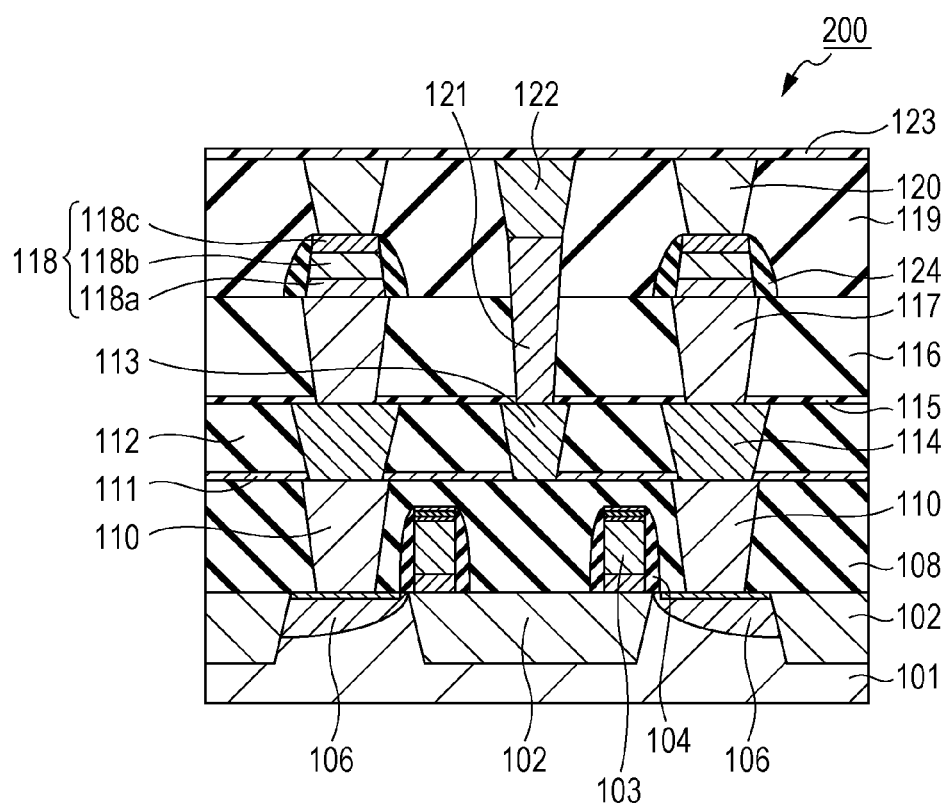
FIG. 7 is a sectional view illustrating an example of a schematic configuration of a nonvolatile memory device according to a second example.

FIG. 7 is a sectional view showing an example of a schematic configuration of a nonvolatile memory device according to a second example. FIG. 7 is a sectional view corresponding to FIG. 5B of the first example. A nonvolatile memory device 200 according to the second example is described below with reference to FIG. 7.

The nonvolatile memory device of the second example is different from the nonvolatile memory device of the first example in that a sidewall 124 including an insulating film is provided on the sidewall of the resistance-change element 118. The sidewall 124 may include a silicon oxide film, a silicon nitride film, a silicon oxycarbide film, a silicon nitrocarbide film, or the like. The thickness of the sidewall 124 is, for example, 20 nm. Since the sidewall 124 is provided, even when deviation occurs in a mask alignment step for forming the second element wiring 120 on the second electrode 118c, etching for the second element wiring 120 is stopped by the sidewall 124. Therefore, short-circuiting between the second element wiring 120 and the resistance-change layer 118b and the first electrode 118a less occurs than in the first example.

With the exception of the points described above, the configuration of the nonvolatile memory device 200 of the second example can be realized with the same configuration as the nonvolatile memory device 100 of the first example. Therefore, the components common to FIGS. 5A to 5E and FIG. 7 are denoted by the same reference numeral and name, and detailed description thereof is omitted.

[Manufacturing Method]

Next, a method for manufacturing the nonvolatile memory device 200 of the second example is described.

FIGS. 8A to 8E are schematic sectional views showing some of the steps of a method for manufacturing the nonvolatile memory device shown in FIG. 7.

Figure 8A:
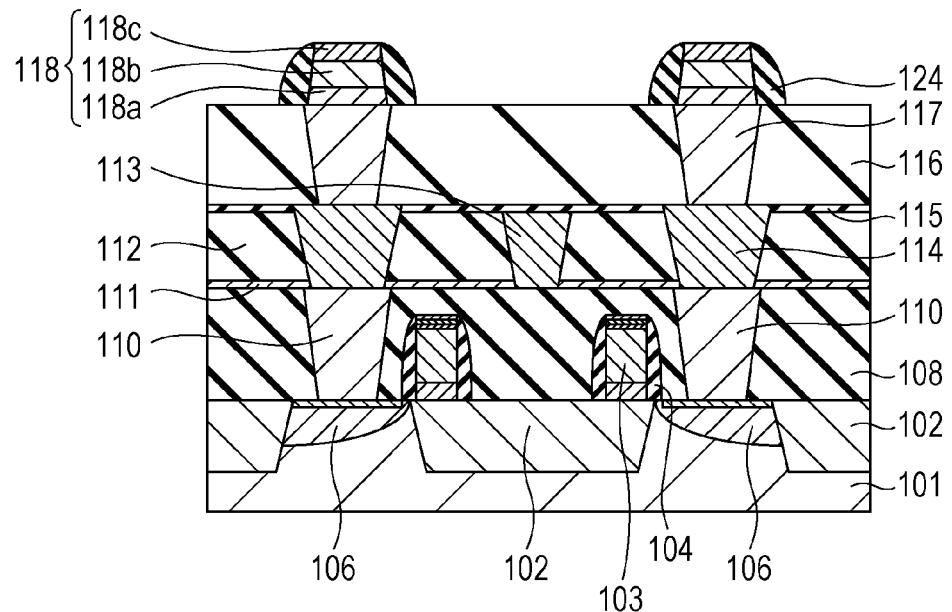
FIG. 8A is a schematic sectional view illustrating a step of a method for manufacturing the nonvolatile memory device shown in FIG. 7.
Figure 8B:
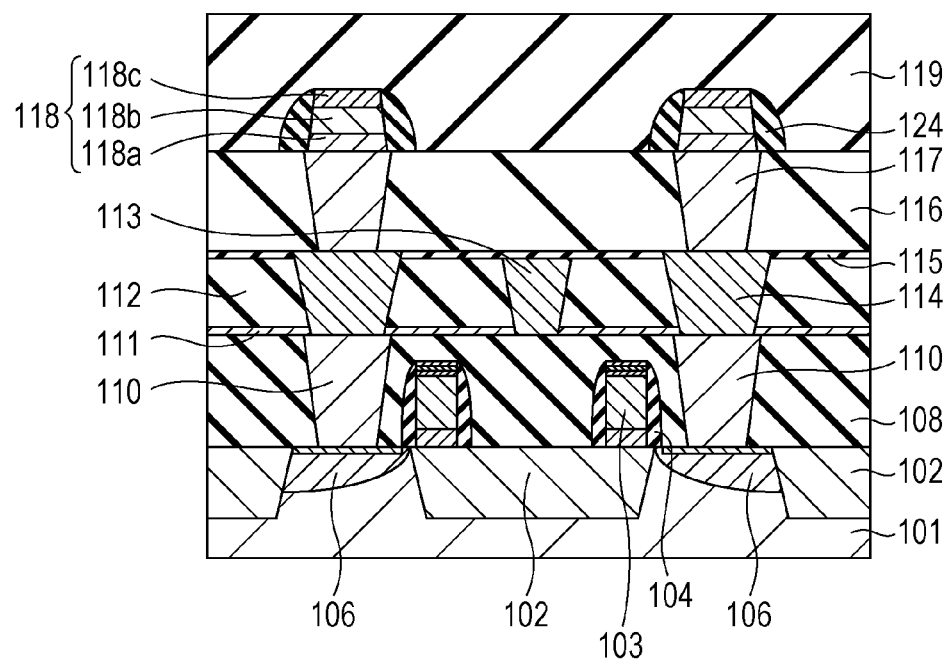
FIG. 8B is a schematic sectional view illustrating a step of a method for manufacturing the nonvolatile memory device shown in FIG. 7.
Figure 8C:
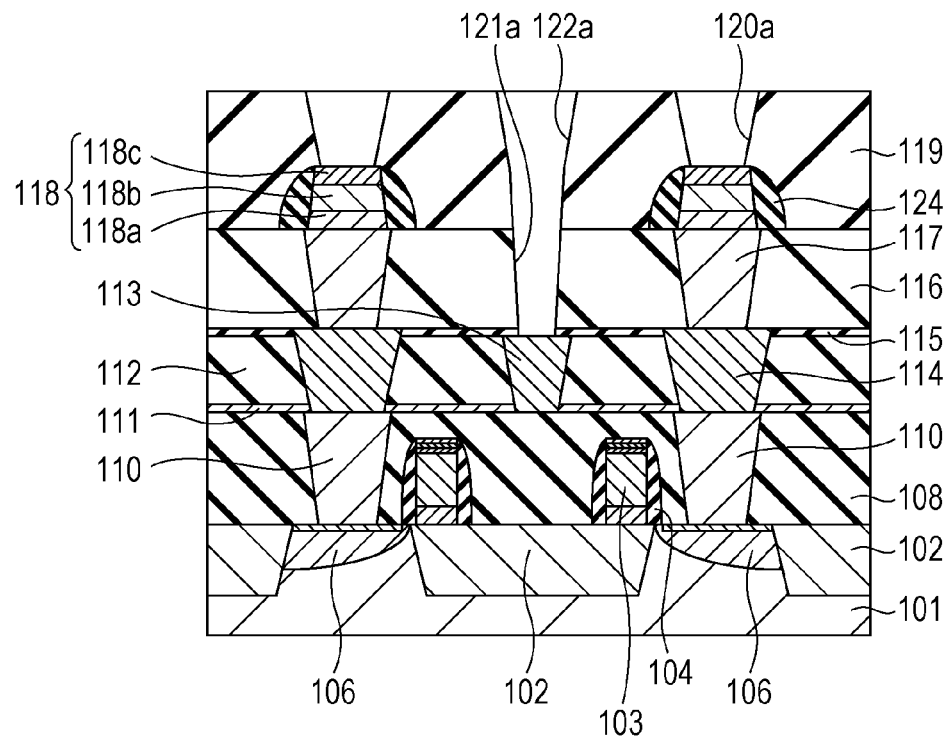
FIG. 8C is a schematic sectional view illustrating a step of a method for manufacturing the nonvolatile memory device shown in FIG. 7.
Figure 8D:
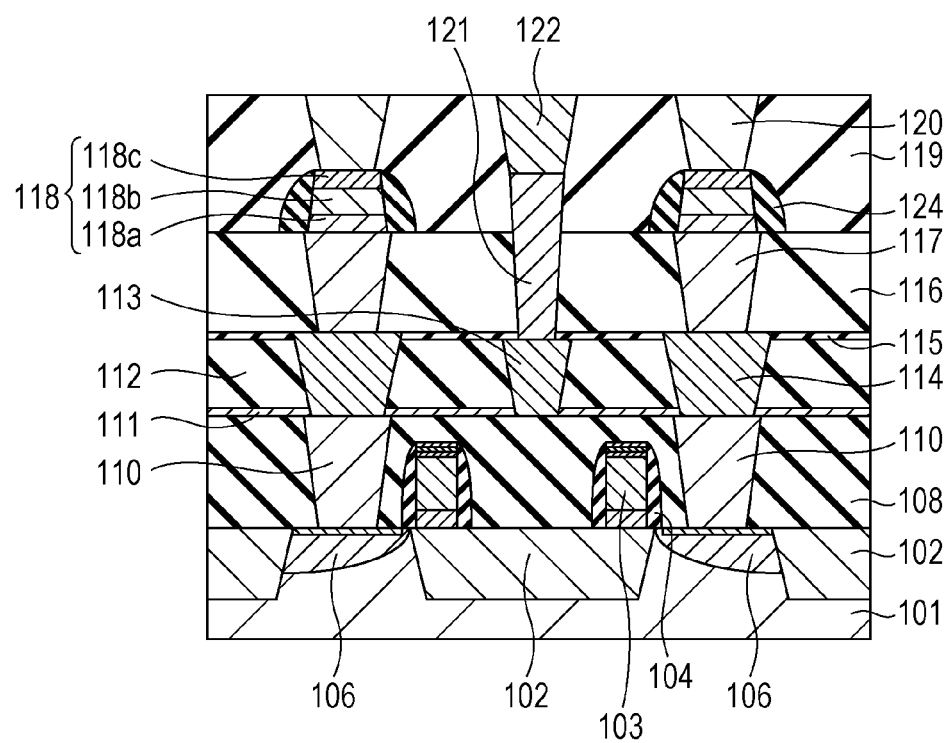
FIG. 8D is a schematic sectional view illustrating a step of a method for manufacturing the nonvolatile memory device shown in FIG. 7.
Figure 8E:
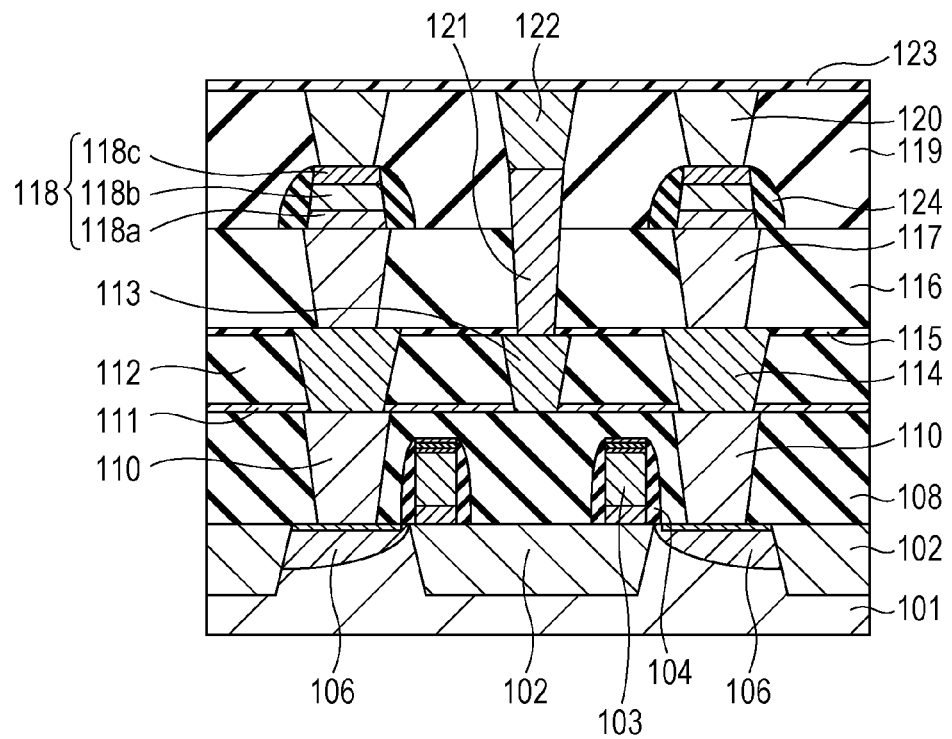
FIG. 8E is a schematic sectional view illustrating a step of a method for manufacturing the nonvolatile memory device shown in FIG. 7.

The steps from the step (step of forming the sidewall 124 on the sidewall of the resistance-change element 118) shown in FIG. 8A to the step (the step of forming the passivation film 123 on the second element wiring 120, the second transistor wiring 122, and the fourth interlayer insulating layer 119) shown in FIG. 8E are described in detail. The steps prior to the step shown in FIG. 8A are the same as in the first example and are thus not described below.

Firs, as shown in FIG. 8A, the resistance-change element 118 is formed, and then a silicon nitride film having a thickness of 5 to 20 nm is deposited by the ALD method. Then, the sidewall 124 having a thickness of 5 to 15 nm is formed by a dry etching method for anisotropic etching.

Then, as shown in FIG. 8B, the fourth interlayer insulating layer 119 mainly composed of silicon oxide is deposited to a thickness of 500 nm and then the upper surface of the fourth interlayer insulating layer 119 is planarized by the CMP method.

Then, as shown in FIG. 8C, a desired mask is placed on the fourth interlayer insulating layer 119, and a first contact hole 121a is provided by dry etching so as to expose the first transistor wiring 113. Then, a third trench 120a is formed by dry etching using another mask so as to expose the second electrode 118c, and at the same time, a fourth trench 122a is formed in a desired shape so as to overlap the first contact hole 121a.

Then, as shown in FIG. 8D, a wiring adhesive layer including a tantalum nitride film with a thickness of 5 nm and a tantalum film with a thickness of 5 nm is deposited by the ALD (Atomic Layer Deposition) method. Then, a wiring metal having a thickness of 300 nm and composed of copper (Cu) is deposited by an electroplating method. Then, the wiring adhesive layer and the wiring metal deposited on the upper surface of the fourth interlayer insulating layer 119 are removed by chemical mechanical polishing (CMP) to form the second element wiring 120, the first contact plug 121, and the second transistor wiring 122.

Each of the second element wiring 120 and the second transistor wiring 122 has, for example, a width of 45 nm and a thickness of 80 nm. The diameter of the first contact plug 121 is, for example, 40 nm.

Then, as shown inn FIG. 8E, the passivation film 123 including, for example, a silicon nitride film having a thickness of 300 nm is deposited to cover the fourth interlayer insulating layer 119, the second element wiring 120, and the second transistor wiring 122.

In the second example, the same modification as described in the first embodiment and the second embodiment can be made.

Although the nonvolatile memory device according to each of the embodiments and the examples is described above, the present disclosure is not limited to the embodiments and the examples. The scope of the present disclosure includes conceivable modifications of the embodiments and another embodiment achieved by combining components without deviating from the gist of the present disclosure.

An aspect of the present disclosure is useful as a nonvolatile memory device capable of decreasing the power consumption during writing in a selected memory element, decreasing the size of memory cells while increasing the operation speed, and stabilizing an operation by decreasing wiring delay by arranging a bit line and a source line in parallel.

What is claimed is:

1. A nonvolatile memory device comprising:
   a substrate;
   a first transistor located on the substrate, the first transistor including a first terminal and a first common terminal;

a second transistor located adjacent to the first transistor in a first direction on the substrate, the second transistor including a second terminal and the first common terminal;

a third transistor located adjacent to the first transistor in a second direction not parallel with the first direction on the substrate, the third transistor including a third terminal and a second common terminal;

a fourth transistor located adjacent to the second transistor in the second direction and adjacent to the third transistor in the first direction, the fourth transistor including a fourth terminal and the second common terminal;

a first first-wiring being gates of the first and third transistors, the first first-wiring extending in the second direction;

a second first-wiring being gates of the second and fourth transistors, the second first-wiring extending in the second direction, the first first-wiring and the second first-wiring being disposed in a first wiring layer;

a first second-wiring extending in the first direction, the first second-wiring partially overlapping with the first first-wiring and the second first-wiring in a plan view, the first second-wiring electrically connected to the first common terminal;

a second second-wiring extending in the first direction, the second second-wiring partially overlapping with the first first-wiring and the second first-wiring in the plan view, the second second-wiring electrically connected with the second common terminal, the first second-wiring and the second second-wiring being disposed in a second wiring layer located above the first wiring layer;

a first third-wiring extending in the first direction;

a second third-wiring extending in the first direction;

a first fourth-wiring extending in the first direction, the first fourth-wiring being located over the first second-wiring and between the first third-wiring and the second third-wiring;

a second fourth-wiring extending in the first direction, the second fourth-wiring being located over the second second-wiring, the second third-wiring being located between the first fourth-wiring and the second fourth-wiring, the first and second third-wirings and the first and second fourth-wirings being disposed in a third wiring layer located above the second wiring layer;

a first resistance-change element electrically connected between the first terminal of the first transistor and the first third-wiring;

a second resistance-change element electrically connected between the second terminal of the second transistor and the first third-wiring;

a third resistance-change element electrically connected between the third terminal of the third transistor and the second third-wiring;

a fourth resistance-change element electrically connected between the fourth terminal of the fourth transistor and the second third-wiring;

a first first-contact plug connecting the first second-wiring to the first fourth-wiring, the first first-contact plug located at an intersection of two virtual diagonals of a tetragon defined by the first, second, third and fourth resistance-change elements in the plan view; and a second first-contact plug connecting the second second-wiring to the second fourth-wiring, the second first-contact plug being in a linear symmetry with the first first-contact plug with respect to second third-wiring in the plan view, wherein the first to fourth resistance-change elements are disposed in a layer above the second wiring layer.

2. The nonvolatile memory device according to claim 1, wherein:
the first second-wiring and first fourth-wiring overlap with each other, and
the second second-wiring and second fourth-wiring overlap with each other.

3. The nonvolatile memory device according to claim 1, further comprising:
a first second-contact plug electrically connected between the first second-wiring and the first common terminal; and
a second second-contact plug electrically connected between the second second-wiring and the second common terminal.

4. The nonvolatile memory device according to claim 3, further comprising:
a first projecting member extending from the first first-contact plug to the first second-contact plug in the plan view; and
a second projecting member extending from the second first-contact plug to the second second-contact plug in the plan view.

5. The nonvolatile memory device according to claim 1, wherein the first, second, third and fourth resistance-change elements each include a lower electrode, an upper electrode and a resistance-change layer located between the lower electrode and the upper electrode.

6. The nonvolatile memory device according to claim 5, wherein the first, second, third and fourth resistance-change elements each further include a sidewall insulator which covers at least a side surface of the resistance-change layer.

7. The nonvolatile memory device according to claim 1, wherein at least one of a width of the first second-wiring and a width of the second second-wiring in the plan view is smaller than each of a width of the first resistance-change element, a width of the second resistance-change element, a width of the third resistance-change element, and a width of the fourth resistance-change element, in the second direction.

8. The nonvolatile memory device according to claim 1, wherein at least one of a width of the first fourth-wiring and a width of the second fourth-wiring in the plan view is smaller than a width of the first resistance-change element, a width of the second resistance-change element, a width of the third resistance-change element, and a width of the fourth resistance-change element, in the second direction.

9. The nonvolatile memory device according to claim 1, further comprising:
a first third-contact plug and a first fourth-contact plug connected between the first terminal and the first resistance-change element, both the first third-contact plug and the first fourth-contact plug being disposed under the first third-wiring;
a second third-contact plug and a second fourth-contact plug connected between the second terminal and the second resistance-change element, both the second third-contact plug and the second fourth-contact plug being disposed under the first third-wiring;
a third third-contact plug and a third fourth-contact plug connected between the third terminal and the third resistance-change element, both the third third-contact plug and the third fourth-contact plug being disposed under the second third-wiring; and
a fourth third-contact plug and a fourth fourth-contact plug connected between the fourth terminal and the fourth resistance-change element, both the fourth third-contact plug and the fourth fourth-contact plug being disposed under the second third-wiring.

10. The nonvolatile memory device according to claim 9, further comprising:
a first conductive member located between the first third-contact plug and the first fourth-contact plug;
a second conductive member located between the second third-contact plug and the second fourth-contact plug;
a third conductive member located between the third third-contact plug and the third fourth-contact plug; and
a fourth conductive member located between the fourth third-contact plug and the fourth fourth-contact plug,
wherein the first to fourth conductive members are disposed in the second wiring layer.

11. The nonvolatile memory device according to claim 1, wherein no resistance-change element is disposed between the first resistance-change element and the third resistance-change element, and no resistance-change element is disposed under the first and second fourth-wirings.

12. A nonvolatile memory device comprising:
a substrate;
a first transistor located on the substrate, the first transistor including a first terminal and a first common terminal;
a second transistor located adjacent to the first transistor in a first direction on the substrate, the second transistor including a second terminal and the first common terminal;
a third transistor located adjacent to the first transistor in a second direction not parallel with the first direction on the substrate, the third transistor including a third terminal and a second common terminal;
a fourth transistor located adjacent to the second transistor in the second direction and adjacent to the third transistor in the first direction, the fourth transistor including a fourth terminal and the second common terminal;
a first first-wiring being gates of the first and third transistors, the first first-wiring extending in the second direction;
a second first-wiring being gates of the second and fourth transistors, the second first-wiring extending in the second direction, the first first-wiring and the second first-wiring being disposed in a first wiring layer;
a second wiring extending in the first direction, the second wiring partially overlapping with the first first-wiring and the second first-wiring in a plan view, the second wiring electrically connected to the first and second common terminals, the second wiring being disposed in a second wiring layer located above the first wiring layer;
a first third-wiring extending in the first direction;
a second third-wiring extending in the first direction;
a fourth wiring extending in the first direction, the fourth wiring being located over the first second-wiring and between the first third-wiring and the second third-wiring, the first third-wiring, the second third-wiring and the fourth wiring being disposed in a third wiring layer located above the second wiring layer;
a first resistance-change element electrically connected between the first terminal of the first transistor and the first third-wiring;
a second resistance-change element electrically connected between the second terminal of the second transistor and the first third-wiring;
a third resistance-change element electrically connected between the third terminal of the third transistor and the second third-wiring;
a fourth resistance-change element electrically connected between the fourth terminal of the fourth transistor and the second third-wiring; and
a first contact plug connecting the second wiring to the fourth wiring, the first contact plug located at an intersection of two virtual diagonals of a tetragon defined by the first, second, third and fourth resistance-change elements in the plan view,
wherein the first to fourth resistance-change elements are disposed in a layer above the second wiring layer.

13. The nonvolatile memory device according to claim 12, wherein the second wiring and fourth wiring overlap with each other.

14. The nonvolatile memory device according to claim 12, further comprising:
a first second-contact plug electrically connected between the second wiring and the first common terminal; and
a second second-contact plug electrically connected between the second wiring and the second common terminal.

15. The nonvolatile memory device according to claim 14, further comprising:
a first projecting member extending from the first contact plug to the first second-contact plug in the plan view; and
a second projecting member extending from the first contact plug to the second second-contact plug in the plan view.

16. The nonvolatile memory device according to claim 12, wherein the first, second, third, and fourth resistance-change elements each include a lower electrode, an upper electrode, and a resistance-change layer located between the lower electrode and the upper electrode.

17. The nonvolatile memory device according to claim 16, wherein the first, second, third, and fourth resistance-change elements each further include a sidewall insulator which covers at least a side surface of the resistance-change layer.

18. The nonvolatile memory device according to claim 12, wherein a width of the second wiring in the plan view is smaller than each of a width of the first resistance-change element, a width of the second resistance-change element, a width of the third resistance-change element, and a width of the fourth resistance-change element, in the second direction.

19. The nonvolatile memory device according to claim 12, wherein a width of the fourth wiring in the plan view is smaller than each of a width of the first resistance-change element, a width of the second resistance-change element, a width of the third resistance-change element, and a width of the fourth resistance-change element, in the second direction.

20. The nonvolatile memory device according to claim 12, further comprising:
a first third-contact plug and a first fourth-contact plug connected between the first terminal and the first resistance-change element, both the first third-contact plug and the first fourth-contact plug being disposed under the first third-wiring;
a second third-contact plug and a second fourth-contact plug connected between the second terminal and the second resistance-change element, both the second third-contact plug and the second fourth-contact plug being disposed under the first third-wiring;
a third third-contact plug and a third fourth-contact plug connected between the third terminal and the third resistance-change element, both the third third-contact plug and the third fourth-contact plug being disposed under the second third-wiring; and a fourth third-contact plug and a fourth fourth-contact plug connected between the fourth terminal and the fourth resistance-change element, both the fourth third-contact plug and the fourth fourth-contact plug being disposed under the second third-wiring.

21. The nonvolatile memory device according to claim 20, further comprising:

a first conductive member located between the first third-contact plug and the first fourth-contact plug;

a second conductive member located between the second third-contact plug and the second fourth-contact plug;

a third conductive member located between the third third-contact plug and the third fourth-contact plug; and a fourth conductive member located between the fourth third-contact plug and the fourth fourth-contact plug, wherein the first to fourth conductive members are disposed in the second wiring layer.

22. The nonvolatile memory device according to claim 12, wherein no resistance-change element is disposed between the first resistance-change element and the third resistance-change element, and no resistance-change element is disposed under the first and second fourth-wirings.

* * * * *